(12) United States Patent
Ikehata et al.

(10) Patent No.: US 7,344,350 B2
(45) Date of Patent: Mar. 18, 2008

(54) TRANSPORTING APPARATUS WITH AIR-SUPPLYING SUPPORT MEANS AND DRIVE-FORCE APPLICATION MEANS

(75) Inventors: Yoshiteru Ikehata, Shiga-ken (JP); Takayoshi Ono, Shiga-ken (JP); Yuichi Morimoto, Shiga-ken (JP)

(73) Assignee: Daifuku Co., Ltd., Osaka (JP)

( * ) Notice: Subject to any disclaimer, the term of this patent is extended or adjusted under 35 U.S.C. 154(b) by 0 days.

(21) Appl. No.: 10/920,843

(22) Filed: Aug. 18, 2004

(65) Prior Publication Data
US 2005/0042070 A1 Feb. 24, 2005

(30) Foreign Application Priority Data
Aug. 21, 2003 (JP) ............................. 2003-297475
Sep. 18, 2003 (JP) ............................. 2003-326285

(51) Int. Cl.
*B65G 53/04* (2006.01)
(52) U.S. Cl. .................. 414/676; 65/182.2; 406/88
(58) Field of Classification Search ................ 406/86, 406/88; 414/676; 65/182.1–182.2
See application file for complete search history.

(56) References Cited

U.S. PATENT DOCUMENTS

| 3,338,697 | A | * | 8/1967 | McMaster et al. | 65/182.2 |
| 3,374,078 | A | * | 3/1968 | Wright | 65/182.2 |
| 3,375,093 | A | * | 3/1968 | Reising | 65/25.4 |
| 3,375,094 | A | * | 3/1968 | McMaster et al. | 65/25.4 |
| 3,395,943 | A | * | 8/1968 | Wilde et al. | 406/88 |
| 3,425,818 | A | * | 2/1969 | Plumat | 65/182.2 |
| 3,473,910 | A | * | 10/1969 | Wilde et al. | 65/182.2 |
| 3,485,616 | A | * | 12/1969 | Nitschke | 65/182.2 |
| 3,488,173 | A | * | 1/1970 | McMaster | 65/25.2 |
| 3,545,813 | A | * | 12/1970 | Matsumoto | 104/138.1 |
| 3,637,362 | A | * | 1/1972 | Oelke et al. | 65/25.2 |
| 3,820,467 | A | * | 6/1974 | Burdick | 104/23.2 |
| 3,834,885 | A | * | 9/1974 | Frank | 65/106 |
| 4,014,576 | A | * | 3/1977 | Druschel et al. | 406/38 |
| 4,059,426 | A | * | 11/1977 | Starr | 65/25.2 |
| 4,567,957 | A | * | 2/1986 | Johnson | 180/124 |
| 5,380,348 | A | * | 1/1995 | Boaz | 65/25.2 |
| 6,053,011 | A | * | 4/2000 | Lisec | 65/104 |
| 6,336,775 | B1 | * | 1/2002 | Morita et al. | 406/88 |
| 6,575,669 | B2 | * | 6/2003 | Takasan | 406/197 |

(Continued)

FOREIGN PATENT DOCUMENTS

| JP | 2002-308423 | | 10/2002 |
| JP | 2002308423 A | * | 10/2002 |
| JP | 2002-321820 | | 11/2002 |
| JP | 2002321820 A | * | 11/2002 |

*Primary Examiner*—Saul Rodriguez
*Assistant Examiner*—Charles Greenhut
(74) *Attorney, Agent, or Firm*—The Webb Law Firm

(57) ABSTRACT

The invention discloses a transporting apparatus that transmits a drive force to a transported object in a state where the transported object is supported by a air-supplying-type support apparatus. In one implementation thereof, a device for transferring drive force to a transported object transfers drive force to one side in the width direction, which is perpendicular to the transporting direction. In another implementation thereof, the transporting apparatus can be switched between a horizontal state in which the transported object is supported substantially horizontally, and an upright state.

28 Claims, 28 Drawing Sheets

U.S. PATENT DOCUMENTS

| | | |
|---|---|---|
| 6,612,418 B2 * | 9/2003 | Flom ........................ 198/460.1 |
| 6,676,365 B2 * | 1/2004 | Adam et al. ................... 406/83 |
| 6,830,145 B2 * | 12/2004 | Flom .......................... 198/617 |
| 7,004,711 B2 * | 2/2006 | Ikehata et al. ............... 414/676 |
| 7,108,474 B2 * | 9/2006 | Moriya et al. ............... 414/676 |
| 7,140,827 B2 * | 11/2006 | Ikehata et al. ............... 414/676 |
| 2005/0002743 A1 * | 1/2005 | Moriya et al. ............... 406/198 |
| 2005/0036873 A1 * | 2/2005 | Ikehata et al. ............... 414/676 |

* cited by examiner

TRANSPORTING APPARATUS WITH AIR-SUPPLYING SUPPORT MEANS AND DRIVE-FORCE APPLICATION MEANS

BACKGROUND OF THE INVENTION

The present invention relates to transporting apparatuses provided with air-supplying-type support means for supplying purified air toward a lower surface of a transported object to contactlessly support the transported object and drive force application means for applying a drive force in the transporting direction to the transported object being supported by the air-supplying-type support means.

Such transporting apparatuses are for transporting objects such as glass substrates for liquid crystal displays, and transport the transported object by applying a drive force with the drive force application means to the transported object that is contactlessly supported by the air-supplying-type support means.

With conventional transporting apparatuses, the drive force application means applies a drive force to both ends in the width direction, which is perpendicular to the transporting direction, of the transported object so as to transport the transported object in a horizontal orientation or a substantially horizontal orientation (for example, see JP 2002-321820A). Also, among conventional transporting apparatuses there are those that support the transported object in an upright orientation with transporting means (for example, see JP 2002-308423A).

With such transporting apparatuses it was necessary to provide the drive force application means with a pair of mechanisms, namely a mechanism for applying a drive force to one end side in the width direction of the transported object and a mechanism for applying a drive force to the other end side in the width direction. Alternatively, it required a mechanism for transmitting motive force from one mechanism on one side to the other mechanism on the other side.

Also, with such conventional transporting apparatuses it was not possible to switch between a state where the transported object is carried in a horizontal orientation or a substantially horizontal orientation and a state where the transported object is carried in an upright orientation. If it were possible to switch between these two states, it would be possible to provide a versatile transporting apparatus that is compatible with various conditions.

SUMMARY OF THE INVENTION

It is an object of the present invention to provide a transporting apparatus with which the structure of the drive force application means can be made simple.

It is a second object of the present invention to provide a transporting apparatus that can switch between a state where the transported object is carried in a horizontal orientation or a substantially horizontal orientation and a state where the transported object is carried in an upright orientation.

DETAILED DESCRIPTION OF PREFERRED EMBODIMENTS

Embodiments of the present invention in which a glass substrate 2 is used as an example of the transported object are described below with reference to the drawings. A plurality of embodiments are described below, and any combination of features disclosed in different embodiments is deemed to fall within the scope of the present invention where there are no contradictions.

First Embodiment

Figure 1:
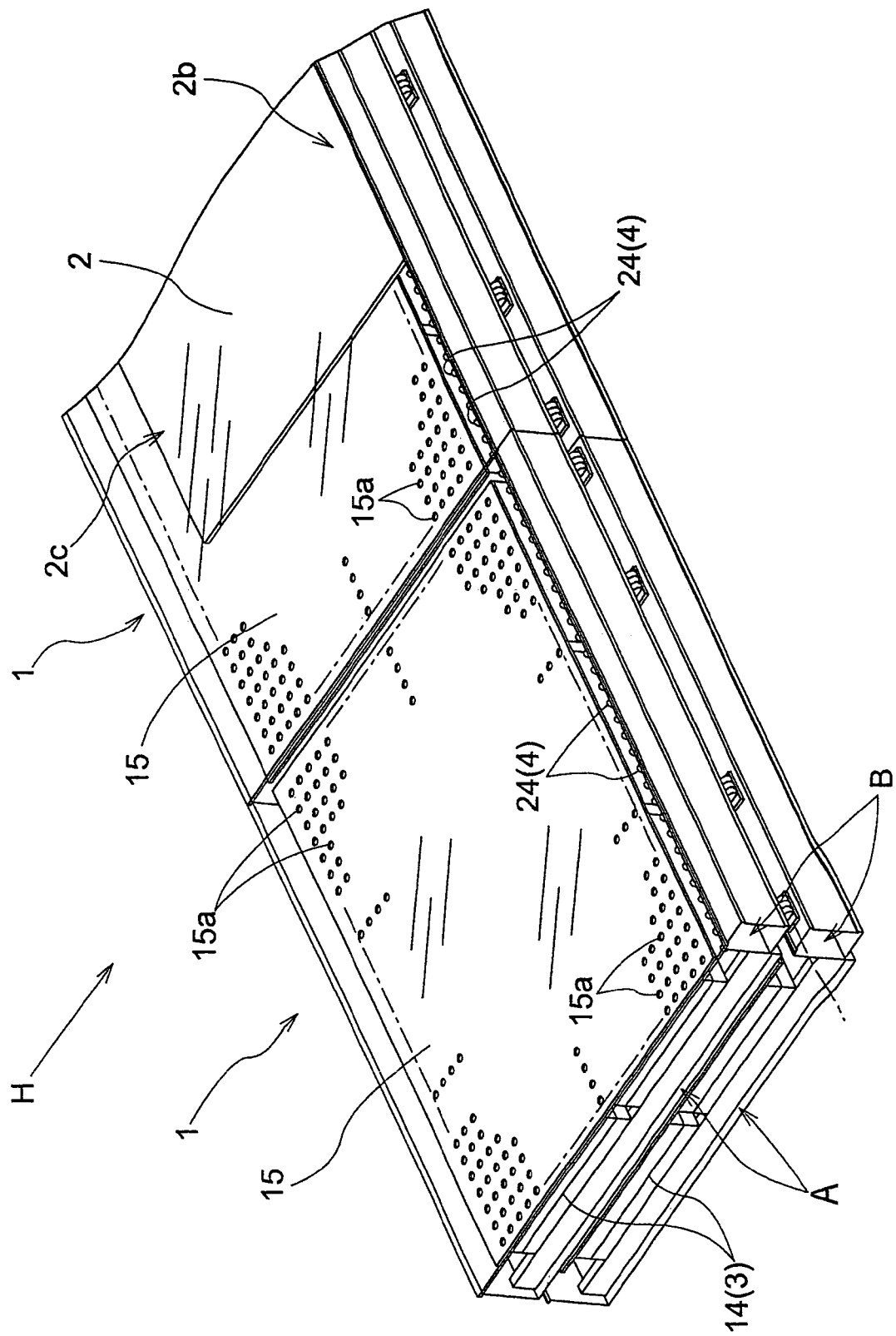
FIG. 1 is a perspective view of a plate-shaped work piece transporting apparatus according to the first embodiment.

As shown in FIG. 1, in a transporting apparatus H, transporting units 1 disposed in two stages, an upper stage and a lower stage, are lined up in the transporting direction of the glass substrate 2. To carry the glass substrate 2 that has been transferred to a transporting unit 1 positioned on the upstream side in the transporting direction to a transporting unit 1 positioned on the downstream side, the glass substrate 2 is supported by a air-supplying-type support means 3 while a drive force is applied thereto by a drive force application means 4. Transfer of the glass substrate 2 from another location to the transporting unit 1 positioned on the upstream side and transfer from the transporting unit 1 positioned on the downstream side to another location is carried out by a device that is not shown. Also, of the transporting units disposed in the upper and lower stages, the upper side units are capable of swinging about a transverse shaft P extending in the transporting direction.

The transporting directions of the upper transporting unit 1 and the lower transporting unit 1 can be the same direction or can be opposite directions, and this can be changed where necessary. That is, for example, when the upper transporting unit 1 and the lower transporting unit 1 have the same transporting direction, then the same steps can be executed for the upper transporting unit 1 and the lower transporting unit 1. When the upper transporting unit 1 and the lower transporting unit 1 have opposite transporting directions, then a defective glass substrate 2 that is carried by the upper transporting unit 1 can be returned to the carry source using the lower transporting unit 1.

Figure 2:
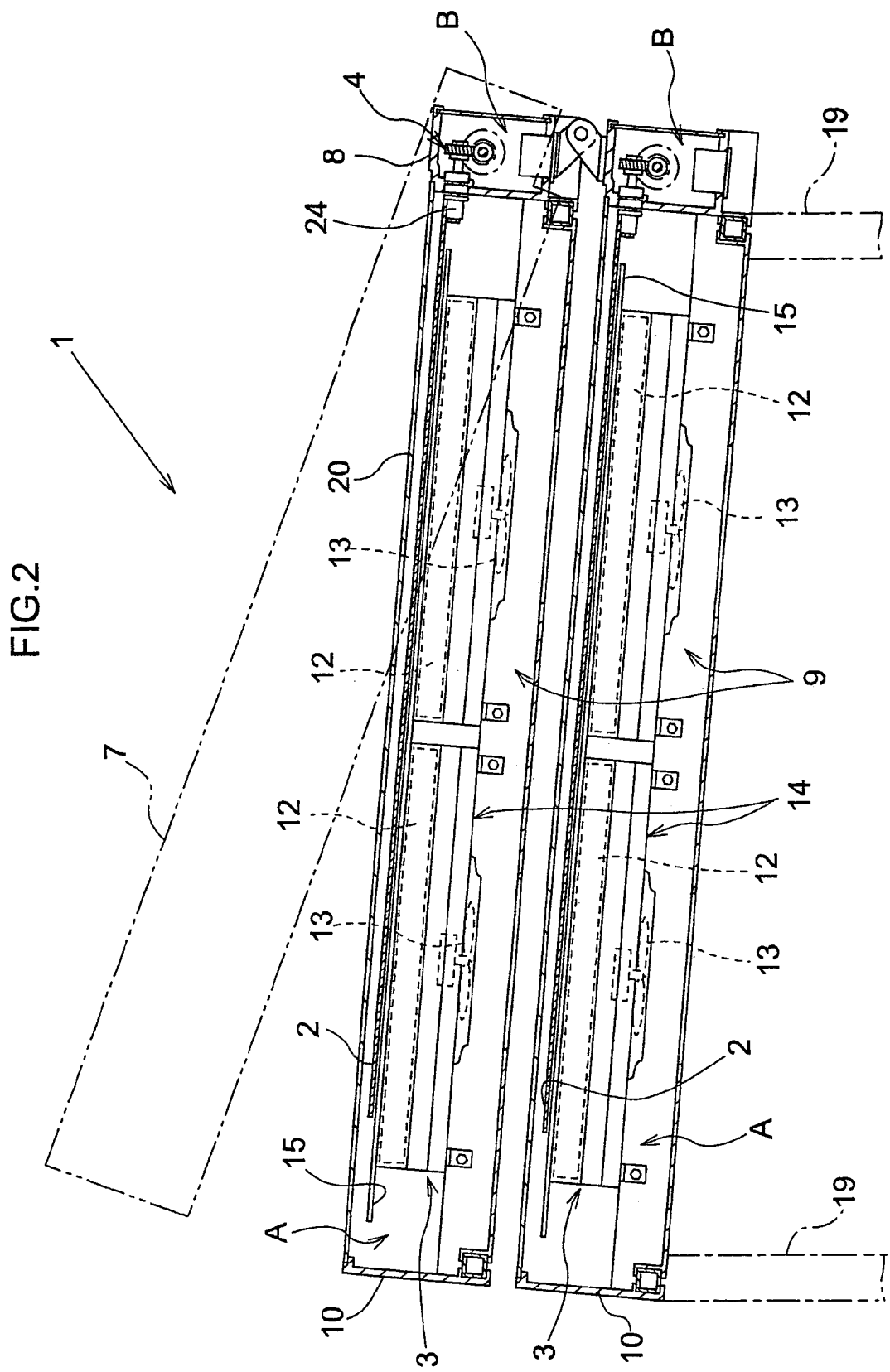
FIG. 2 is a front sectional view of the transporting unit according to the first embodiment.
Figure 3:
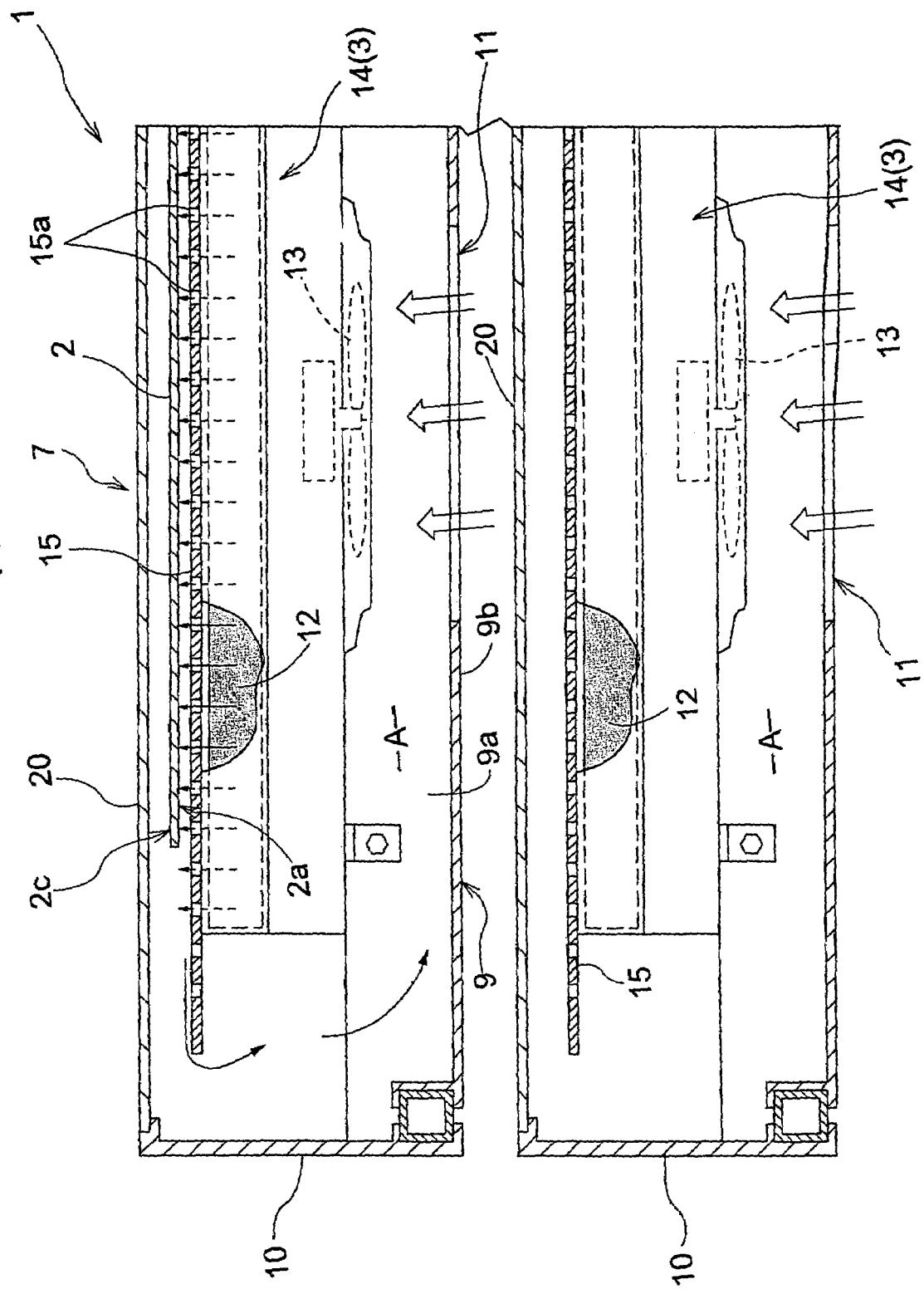
FIG. 3 is a partially magnified front sectional view of the transporting unit according to the first embodiment.

As shown in FIGS. 2 and 3, the transporting units 1 are provided with air-supplying-type support means 3 for supplying purified air toward a lower surface 2a of the glass substrate 2 to contactlessly support the glass substrate 2 in a substantially horizontal orientation, drive force application means 4 for applying a drive force in the transporting direction to the glass substrate 2, and a casing member 7 in which the air-supplying-type support means 3 and the drive force application means 4 are accommodated. Also, the drive force application means 4 is a single-side driving type for applying a drive force to one end side in the width direction, which is perpendicular to the transporting direction. Hereinafter, this one end side is referred to as the drive side 2b.

Figure 4:
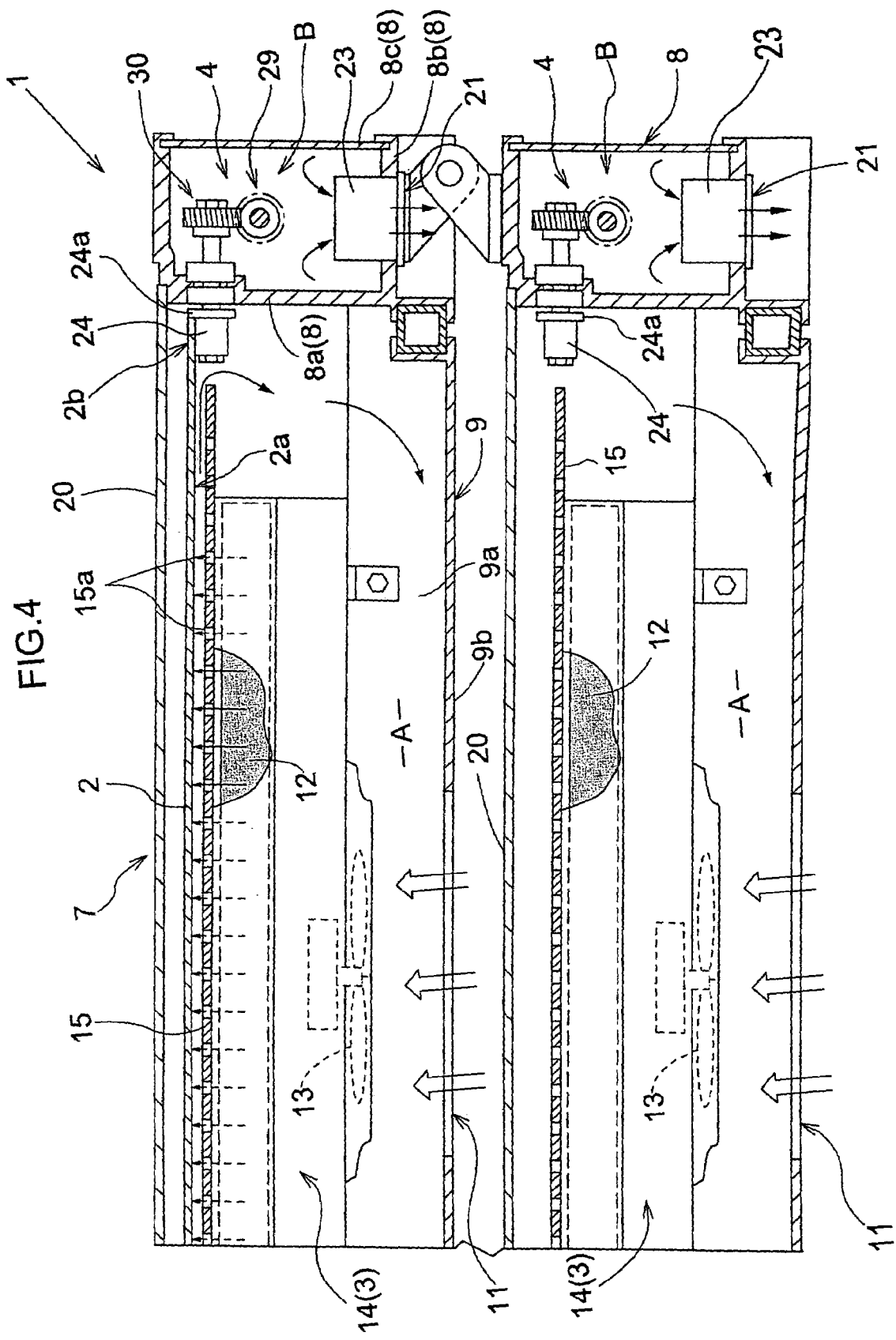
FIG. 4 is a partially magnified front sectional view of the transporting unit according to the first embodiment.
Figure 5:
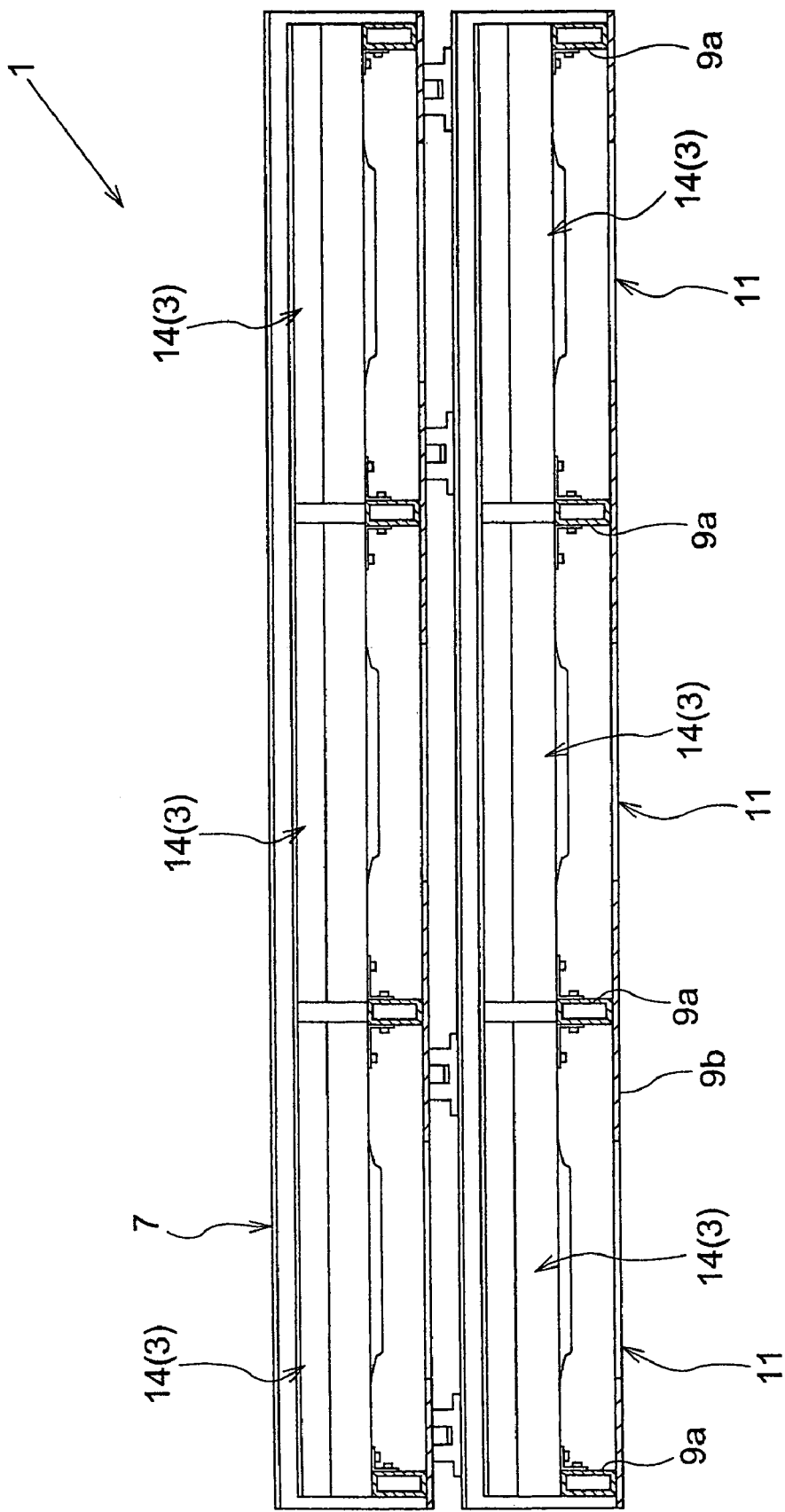
FIG. 5 is a lateral sectional view of the transporting unit according to the first embodiment.

As shown in FIG. 2, the casing member 7 is provided with a unit frame member 9 that is substantially elongate if viewed from above and that supports the air-supplying-type support means 3, an accommodation frame 8 provided on the one end side in the width direction of the unit frame member 9, a casing lateral wall 10 extending in the trans-porting direction on the side opposite the accommodation frame 8, and a transport cover 20 spanning from an upper end portion of the accommodation frame 8 to an upper end portion of the casing lateral wall 10. As shown in FIG. 4, viewed in the transporting direction the accommodation frame 8 has the shape of a rectangular cylinder. The two lateral walls of this rectangular cylinder are an inner wall 8a that is linked to the unit frame member 9 and an accommodation cover 8c that can be opened and closed. The unit frame member 9, the accommodation frame 8, the casing lateral wall 10, and the transport cover 20 together form a transport space A. Moreover, an accommodation space B is formed within the accommodation frame 8. The unit frame member 9 is made of a support frame portion 9a having a frame member and a plate-shaped frame portion 9b that is a member positioned below the support frame portion 9a and that forms an air opening 11 for introducing outside air into the transport space A. On a lower wall 8b of the accommodation frame 8 are provided an outside discharge opening 21 for discharging air within the accommodation space B to the outside and a sub-air-supplying unit 23 having a blowing function and a dust removal function that is provided such that it blocks the outside discharge opening 21. The air within the accommodation space B is discharged to the outside by the sub-air-supplying unit 23.

As shown in FIG. 2, the casing member 7 is inclined by a sloped support portion 19 such that the side on which the accommodation frame 8 is provided when viewed in the transporting direction is positioned lower than the other side. Also, because the casing member 7 is supported in a sloped state, the air-supplying-type support means 3 also is supported on the unit frame member 9 in a sloped orientation. To facilitate understanding of the slope of the transporting unit 1, in FIG. 2 the entire transporting unit 1, including the air-supplying-type support means 3, is shown sloped by 5°, but when practicing the invention of the present application, the slope of the transporting unit 1 can be a miniscule slope of about 0.5°.

The transport spaces A and the accommodation spaces B respectively of the upstream transporting unit 1 and the downstream transporting unit 1, provided side by side in the transporting direction, are in communication with one another. In the transporting unit 1 positioned most upstream in the transporting apparatus H, the upstream end portions of the transport space A and the accommodation space B are blocked by blocking members, which are not shown. In the transporting unit 1 positioned most downstream, the downstream end portions of the transport space A and the accommodation space B are blocked by blocking members. Consequently, the transport space A is formed substantially sealed by the unit frame member 9, the inner wall 8a of the accommodation frame 8, the transport cover 20, and the blocking member, and the accommodation space B is formed substantially sealed by the accommodation frame 8 and the blocking member.

Figure 6:
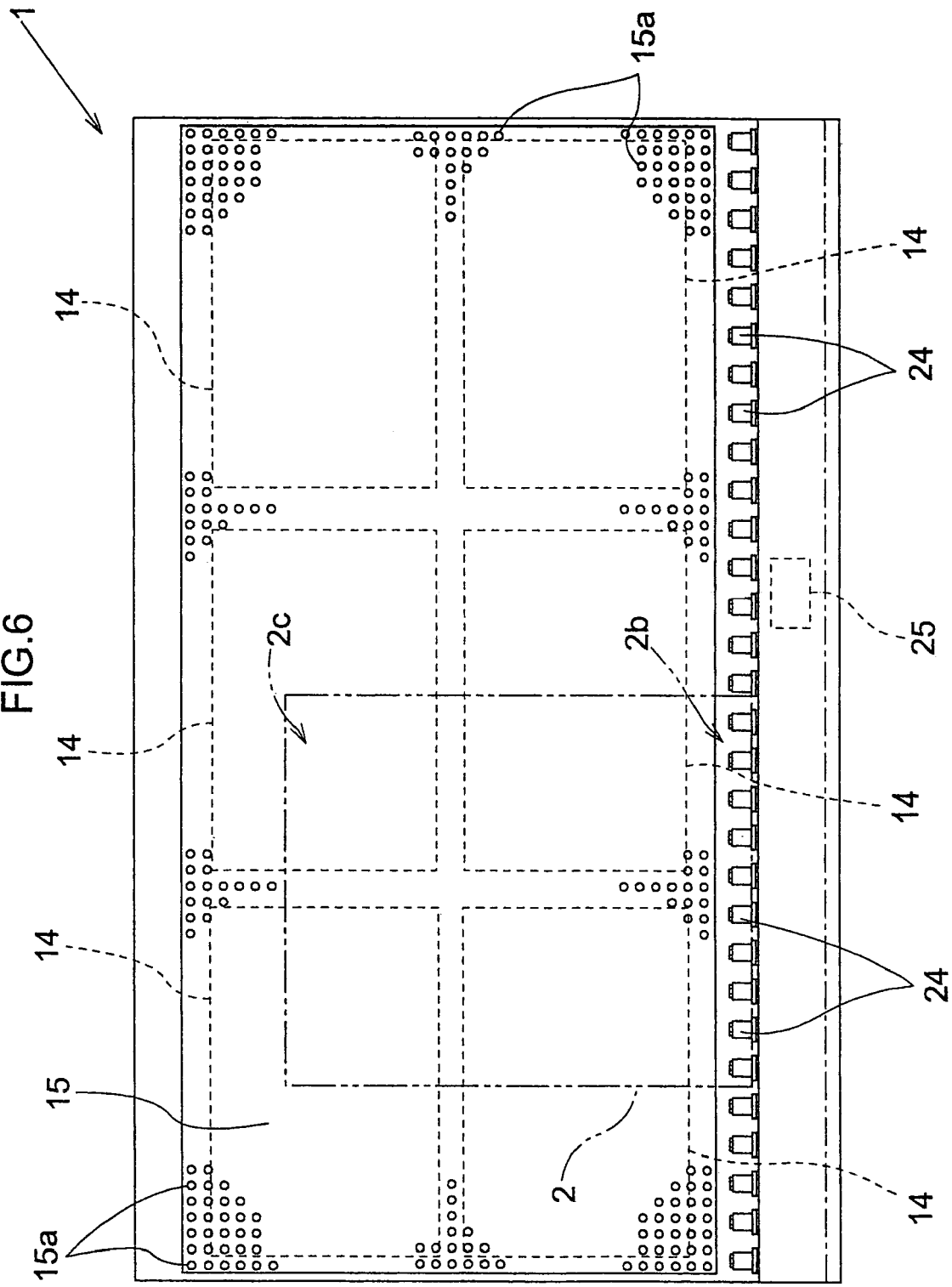
FIG. 6 is a plan view of the transporting unit according to the first embodiment.
Figure 7:
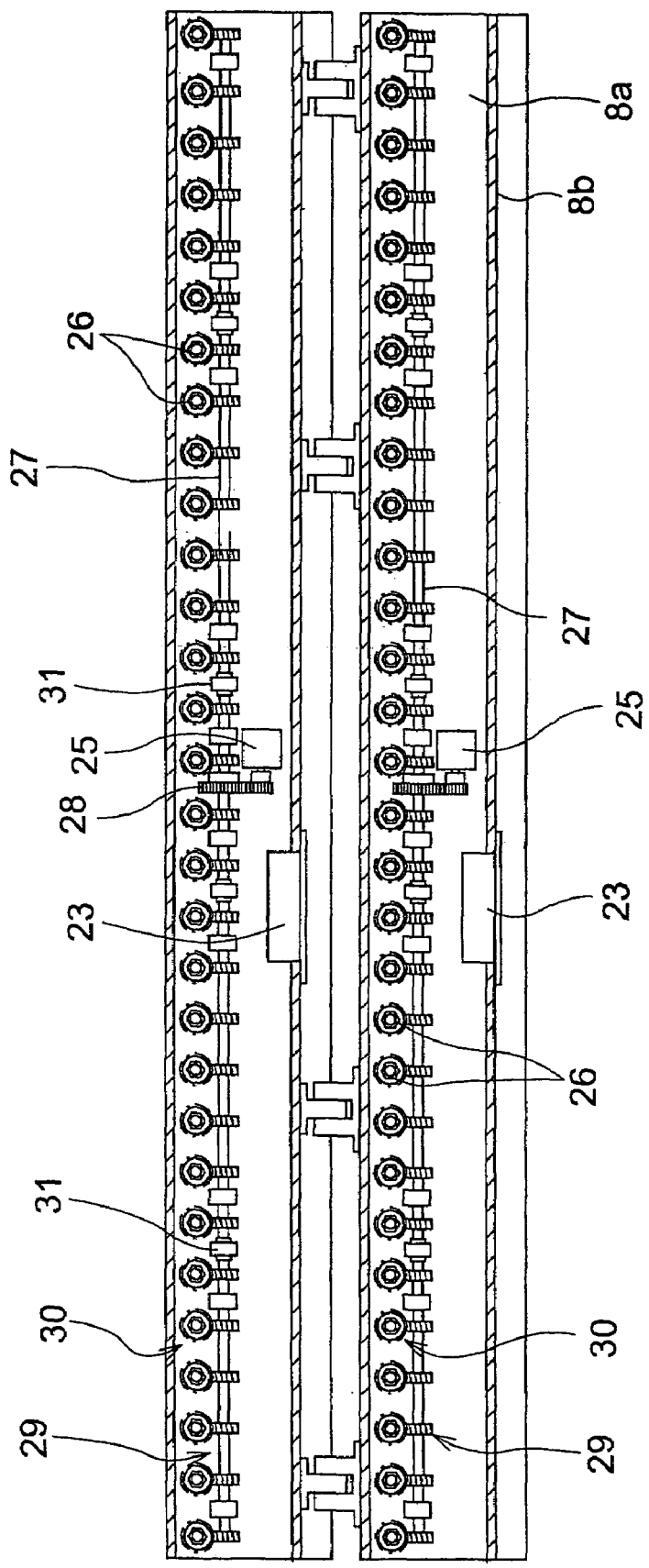
FIG. 7 is a lateral sectional view of the accommodation frame according to the first embodiment.
Figure 8:
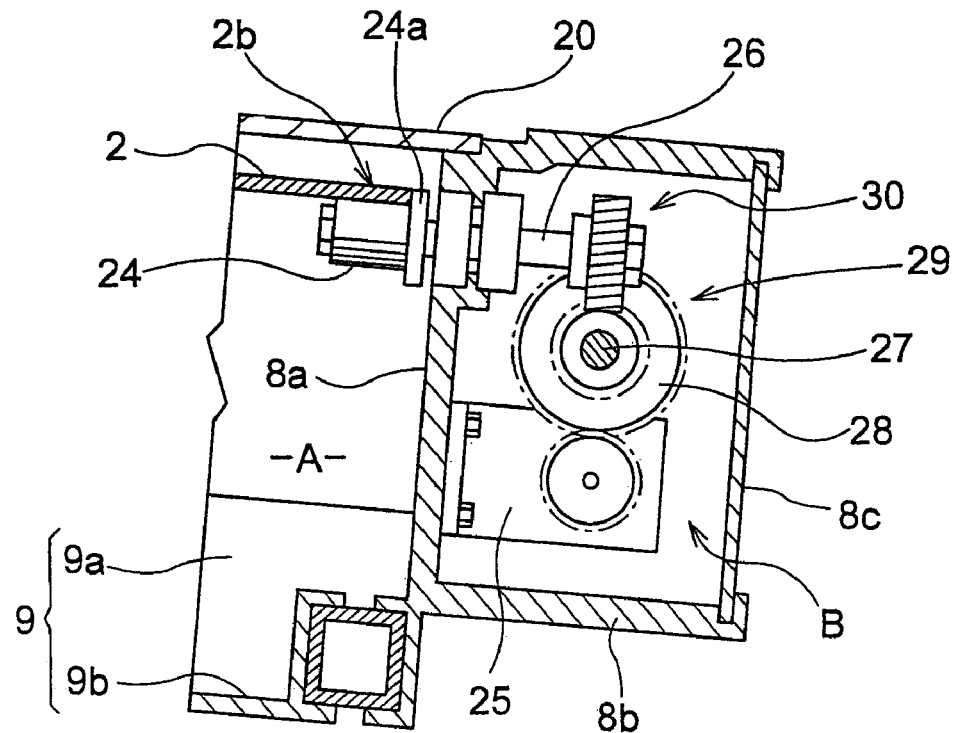
FIG. 8 is a front sectional view of the drive force application means according to the first embodiment.

As shown in FIG. 2, the air-supplying-type support means 3 is provided in the transport space A, and is made of fan filter units 14, in which a dust removal filter 12 for removing dust and a blower fan 13 for supplying purified air toward the lower surface of the glass substrate 2 through the dust removal filter 12 are incorporated into a single unit, are lined up in the transporting direction and in the width direction, which is perpendicular to the transporting direction. The blower fan 13 is a preferable example of a air-supplying means. Also, as shown in FIG. 6, two fan filter units 14 are lined up in the width direction and three fan filter units 14 are lined up in the transporting direction, for a total of six fan filter units 14 provided in the air-supplying-type support means 3.

To describe the air-supplying-type support means 3 in more detail, as shown in FIG. 3 and FIG. 4, each of the fan-filter units 14 is constructed by integrally combining a single blower fan 13 and a single dust-removal filter 12 covering an upper side of the blower fans 13 using a housing. An air rectifying plate 15 (or a porous member) serving as a purified air supply portion that is positioned on an upper side of the fan filter units 14 and that is for rectifying the purified air that is supplied to the lower surface 2*a* of the glass substrate 2 is provided covering the area above the six fan filter units 14 as shown in FIG. 1 and FIG. 6. That is, the air-supplying-type support means 3 is made of six fan filter units 14 and a single air rectifying plate 15. The blower fans 13 are driven by drive motors. The air rectifying plate 15 is provided with through holes 15*a* formed by a punching press at locations positioned directly above the fan filter units. In this context, rectifying air refers to spreading air to wide area so that air is uniformly distributed. Also, the six blower fans provided in the air-supplying-type support means 3 are configured such that they are driven at the same rotation velocity, and the air-supplying-type support means 3 is configured such that it supplies substantially the same amount of purified air to a lower surface 2*a* of the glass substrate 2 through the air rectifying plate 15 in both the transporting direction and the width direction.

Also, as mentioned above, the transporting units 1 are supported in a sloping manner in which the side provided with the accommodation frame 8 when viewed in the transporting direction is positioned lowest, and thus, portions of the air-supplying-type support means 3 that are closer to the drive side 2*b* are positioned progressively lower. Thus, as shown in FIGS. 2 to 4, the air rectifying plate 15 provided in the width direction in the air-supplying-type support means 3 is similarly sloped.

Figure 9:
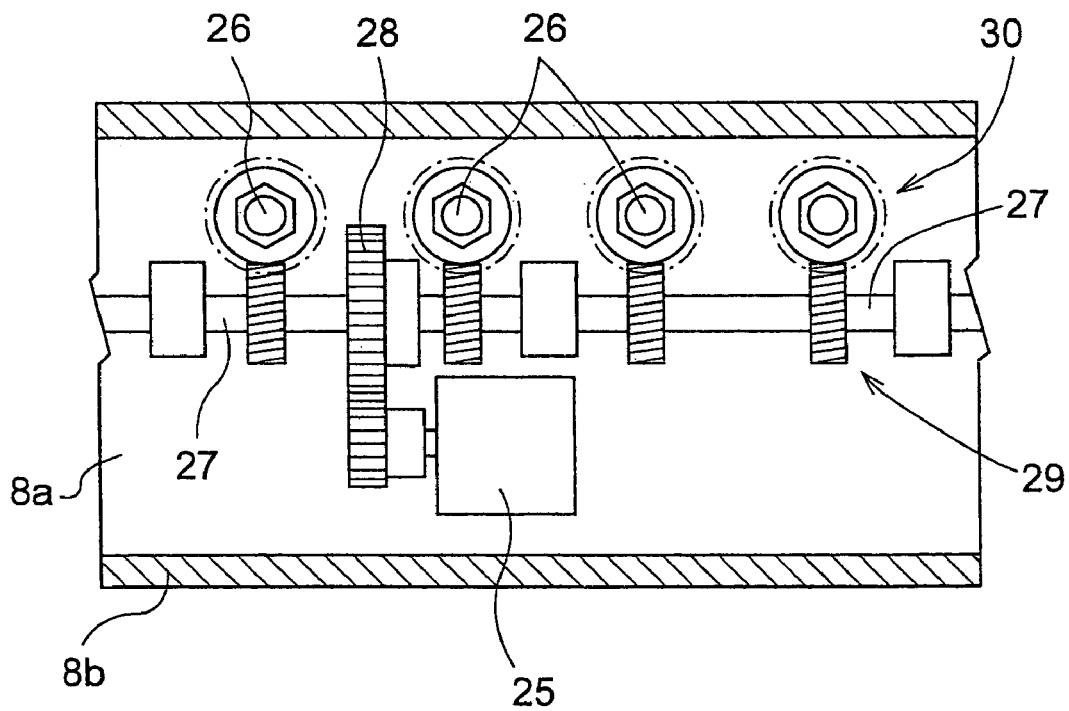
FIG. 9 is a lateral sectional view of the drive force application means according to the first embodiment.

The drive force application means 4 is described next. As shown in FIG. 2, the drive force application means 4 for applying a drive force to the glass substrate 2 is a single-side driving means for applying a drive force to the drive side 2*b* of the glass substrate 2. The drive force application means 4 is provided with drive rollers 24 as drive portions for supporting the lower surface 2*a* of the glass substrate 2 in a contacting manner and applying drive force. As shown in FIG. 4 and FIG. 9, the drive rollers 24 are provided with a large diameter portion 24*a* serving as a stop portion that abuts against the lateral surface of the drive side 2*b* of the glass substrate 2 in order to keep the glass substrate 2 from moving in the width direction.

The drive force application means 4, as shown in FIGS. 4, 8, 9, and 10, is provided with an electric motor 25, a power transmission shaft 27 provided with a spur gear 28 that meshes with the output gear of the electric motor 25, and numerous output shafts 26 provided with an input gear 30 that meshes with an output gear 29 provided on the power transmission shaft 27. Also, the electric motor 25 and the power transmission shaft 27 are provided within the accommodation space B, and the output shafts 26 are rotatively supported on the inner wall 8*a* in such a manner that each projects toward the accommodation space B and the transport space A. The input gears 30 are provided at portions where the output shafts 26 project into the accommodation space B, and the drive rollers 24 are provided at portions where the output shafts 26 project into the transport space A.

Consequently, the air sucked in from below the blower fans 13 is then sent through the dust removal filters 12 by the blower fans 13 and supplied to the lower surface 2*a* of the glass substrate 2 as purified air after passing through the through holes 15*a* of the air rectifying plate 15. Substantially the entire area of the lower surface 2*a* of the glass substrate 2 is supported by this purified air. Also, the drive force application means 4 supports the lower surface on the drive side 2*b* of the glass substrate 2 in a contacting manner with the drive rollers 24. The drive rollers 24 are rotatively driven by the electric motor 25 and apply a drive force in the transporting direction to the drive side 2*b* of the glass substrate 2, thereby transporting the glass substrate 2.

Substantially the same amount of purified air is supplied to the lower surface 2*a* of the glass substrate 2 from the air rectifying plate 15 in both the transporting direction and the width direction to support the glass substrate 2, leaving substantially constant spacing between the glass substrate 2 and the air rectifying plate 15. Thus, because drive side 2*b* of the air rectifying plate 15 is positioned lower, the glass substrate 2 is also supported in a sloped orientation such that its distal end side 2*c* is positioned higher than the drive side 2*b*. It should be noted that the glass 2 in this sloped orientation has a miniscule slope of about 0.5°, and falls within the scope of a substantially horizontal orientation.

Consequently, because the glass substrate 2 is supported in a sloped orientation, the glass substrate 2 tends to move toward the side on which the drive force application means 4 is provided due to its own weight, but movement of the glass substrate 2 is restricted because the glass substrate 2 abuts against the large diameter portion 24*a* of the drive rollers 24. Also, its own weight makes it unlikely that the glass substrate 2 will move toward the distal end side of the glass substrate 2, and thus it is possible to prevent the glass substrate from shifting in the width direction or from tilting away from the transporting direction when the glass substrate is stopped after transporting has finished. Further, the glass substrate 2 pushes against the drive rollers 24 under its own weight, and thus the glass substrate 2 can be carried with very little likelihood of the drive rollers slipping freely. It is also possible to employ the mechanism shown in FIG. 23 and described below, instead of providing the drive rollers 24 with the large diameter portion 24*a*.

Second Embodiment

In the first embodiment, the glass substrate 2 is supported in a sloped orientation by the air-supplying-type support means 3, and by providing the drive rollers 24 with a large diameter portion 24*a*, the glass substrate 2 is kept from moving in the width direction. However, it is also possible to adopt the following configuration, in which movement in the width direction of a glass substrate 2 (that is supported in a horizontal orientation by the air-supplying-type support means 3) is prevented. It should be noted that portions having the same configuration as in the first embodiment are assigned reference numerals identical to those of the first embodiment and description thereof is omitted.

Figure 10:
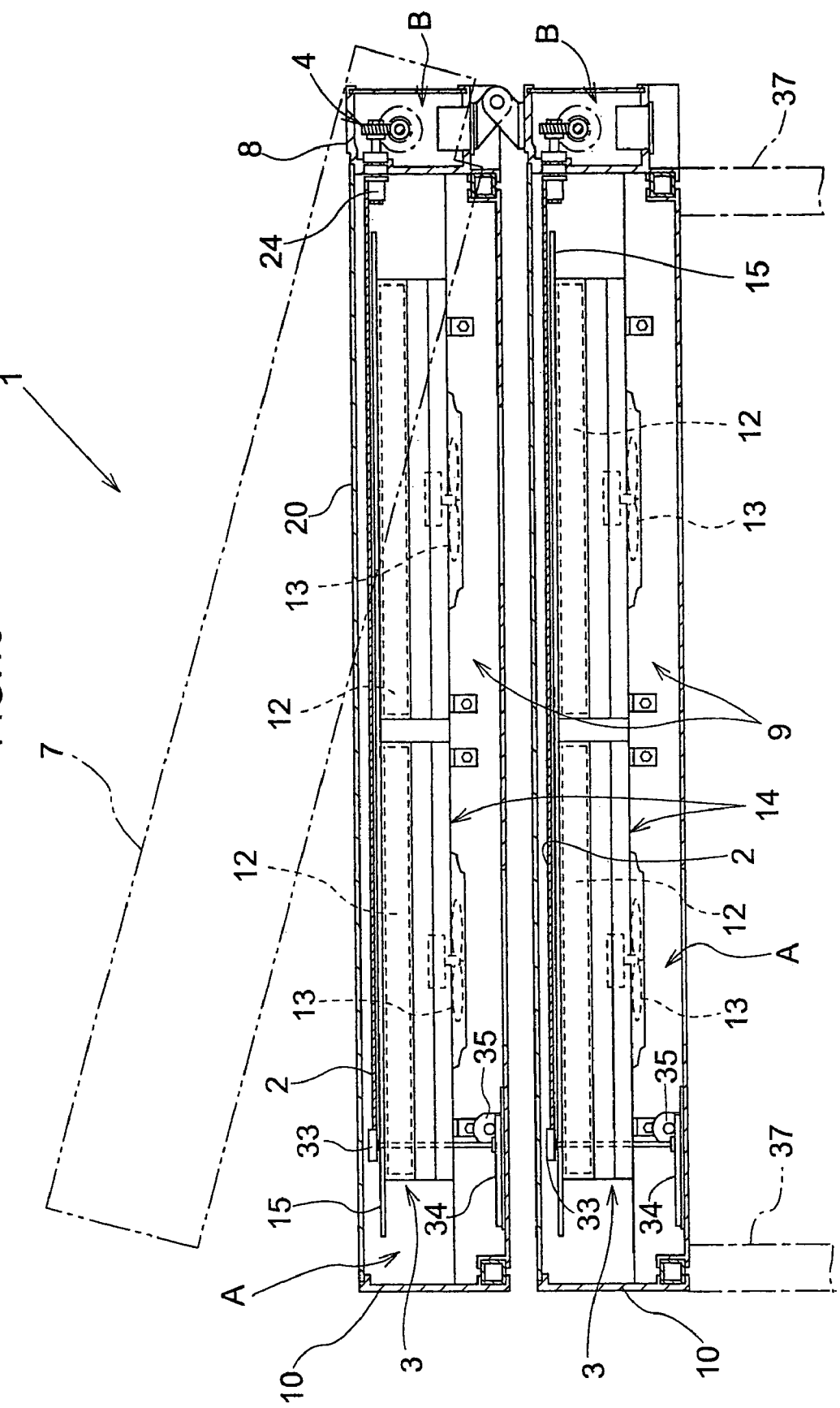
FIG. 10 is a front sectional view of the transporting unit according to the second embodiment.

As shown in FIG. 10, when viewed in the transporting direction the casing member 7 is supported in a horizontal state by a horizontal support member 37, and the air-supplying-type support means 3 that is supported on the casing member 7 is also supported in a horizontal orientation. Consequently, the air rectifying plate 15 is also provided in a horizontal orientation.

Thus, substantially the same amount of purified air is supplied to the lower surface 2*a* of the glass substrate 2 from the air rectifying plate 15 in both the transporting direction and the width direction, such that the glass substrate 2 is supported with a substantially constant interval between the glass substrate 2 and the air rectifying plate 15. Thus, because the air rectifying plate 15 is provided in a horizontal state, the glass substrate 2 is supported in a horizontal orientation.

Also, the transport space A is provided with numerous restricting rollers 33 serving as restricting members that abut against the lateral surface of the distal end side 2c of the glass substrate 2, which is on the side that is opposite the drive side 2b in the width direction, so as to restricting movement of the glass substrate 2 in the width direction. The position of each regulating roller 33 can be adjusted in the width direction.

Figure 11:
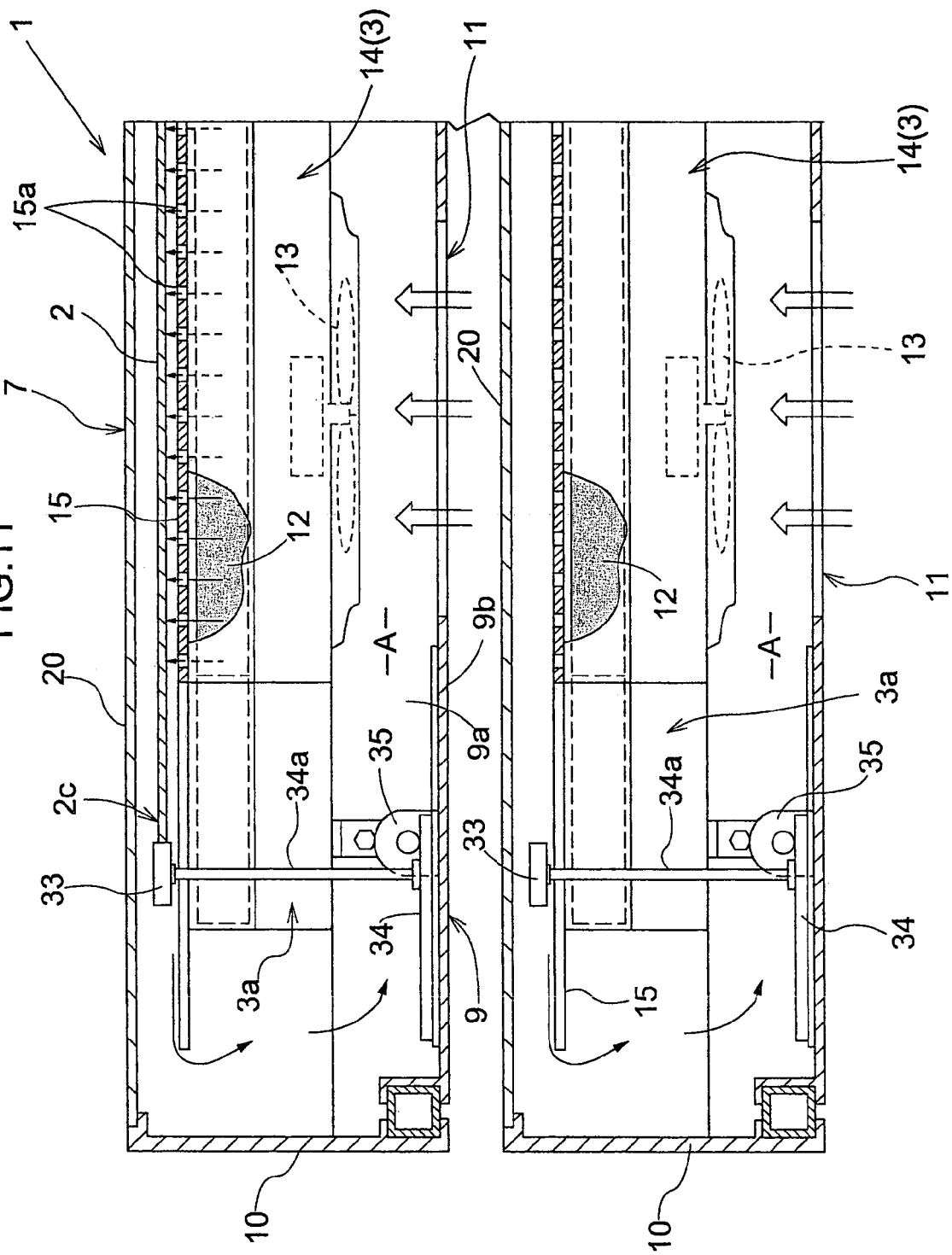
FIG. 11 is a partially magnified front sectional view of the transporting unit according to the second embodiment.

The structure for adjusting the position of the restricting rollers 33 is described next. As shown in FIG. 11, the restricting rollers 33 are supported in such a manner that they can rotate about vertical shafts provided in a roller support frame 34. The roller support frame 34 can be slidably moved in the width direction by an electric motor 35 that is supported on the unit frame member 9. Consequently, by slidably moving the roller support member 34 in the width direction using the motor 35, the position of the restricting rollers 33 is adjusted in the width direction. Also, a recessed portion 3a is formed at a location that corresponds to a vertical frame portion 34a of the roller support frame 34 in the air-supplying-type support means 3 such that the roller support frame 34 and the air-supplying-type support means 3 do not interfere with each other.

Consequently, movement toward the one side in the width direction of the glass substrate 2 is restricted by the large diameter portions 24a of the drive rollers 24, and movement toward the distal end side in the width direction of the glass substrate 2 is restricted by the restricting rollers 33, and thus it is possible to keep the glass substrate 2 from shifting in the width direction or from its orientation tilting in the transporting direction when the glass substrate is stopped after transporting has finished, for example.

Figure 12:
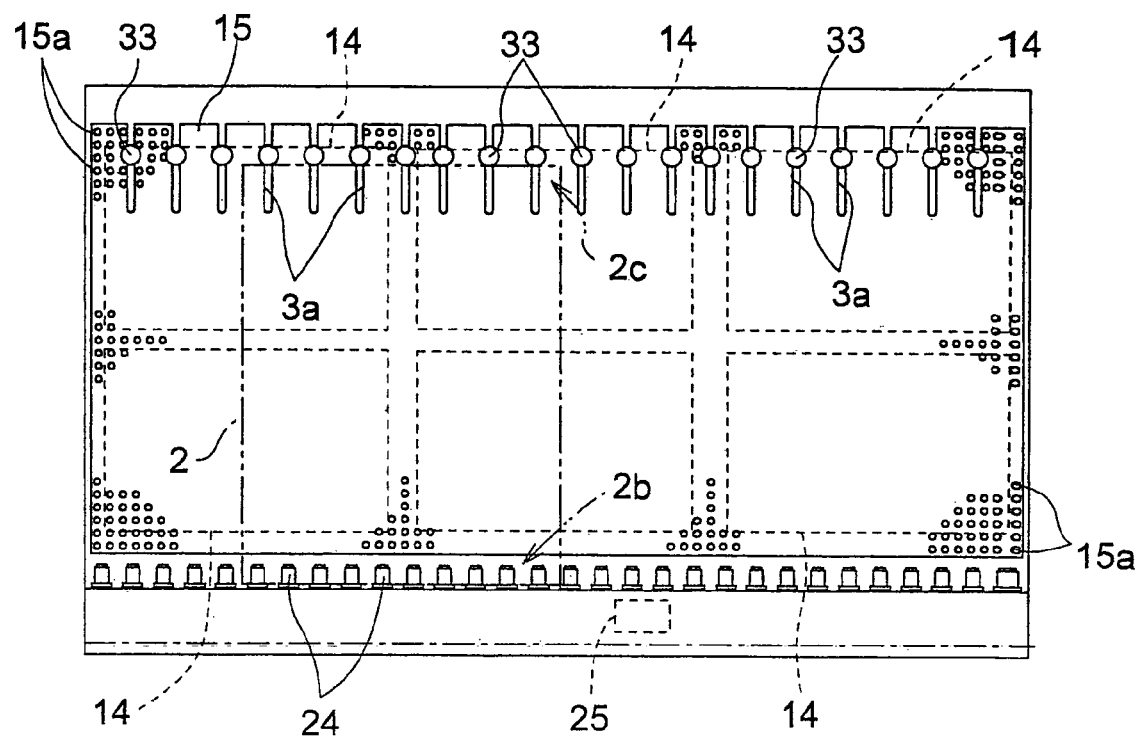
FIG. 12 is a plan view of the transporting unit according to the second embodiment.
Figure 13:
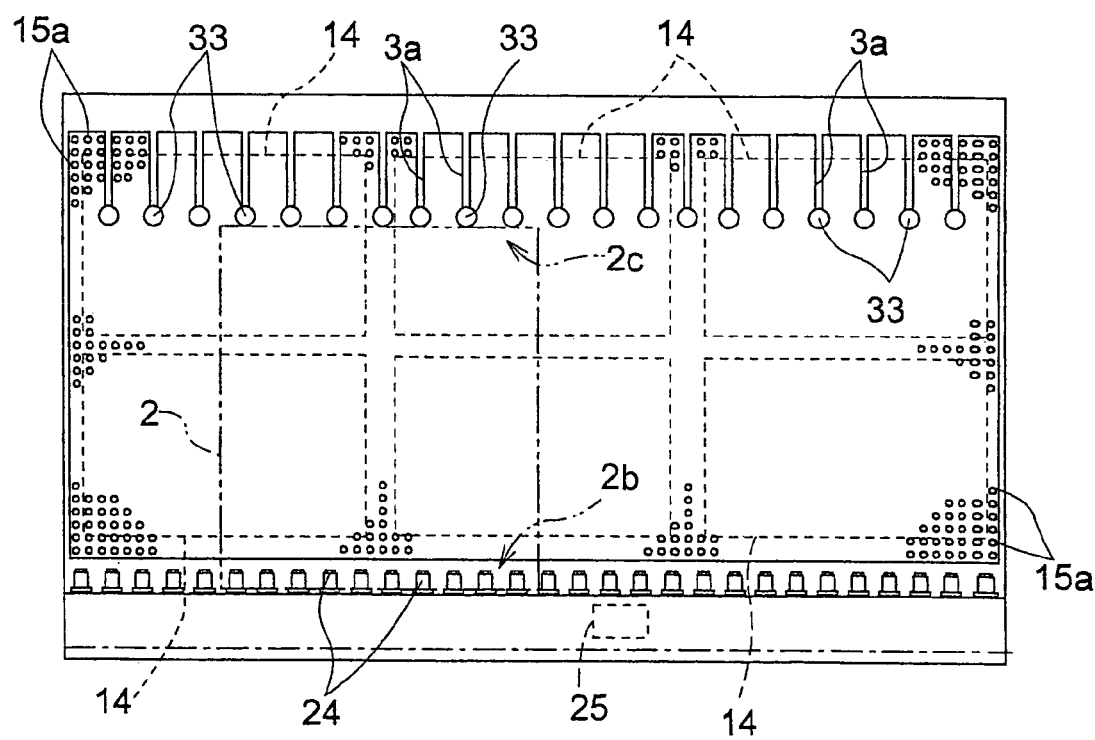
FIG. 13 is a plan view of the transporting unit according to the second embodiment.

Further, as shown in FIG. 12 and FIG. 13, by adjusting the positions of the restricting rollers 33 in the width direction so that the spacing between the large diameter portion 24a of the drive rollers 24 and the restricting rollers 33 matches the size of the glass substrate 2 in the width direction, the transported glass substrate 2 no longer rotates or shifts in the width direction, allowing the glass substrate 2 to be transported smoothly regardless of the size of the glass substrate 2 in the width direction.

Third Embodiment

In the first embodiment, when viewed in the transporting direction the air-supplying-type support means 3 is supported in a sloped orientation, the portions of the purified air supply portion closer to the distal end side 2c is progressively higher, and the glass substrate 2 is supported in a sloped orientation. However, it is also possible to adopt a configuration in which the air rectifying plate 15 is provided such that it supplies more purified air to the distal end side 2c in the width direction than the drive side 2b to which a drive force is applied by the drive force application means 4 so as to support the glass substrate 2 in a sloped orientation. It should be noted that elements having the same configuration as in the first embodiment are assigned reference numerals identical to those of the first embodiment and description thereof is omitted.

Figure 14:
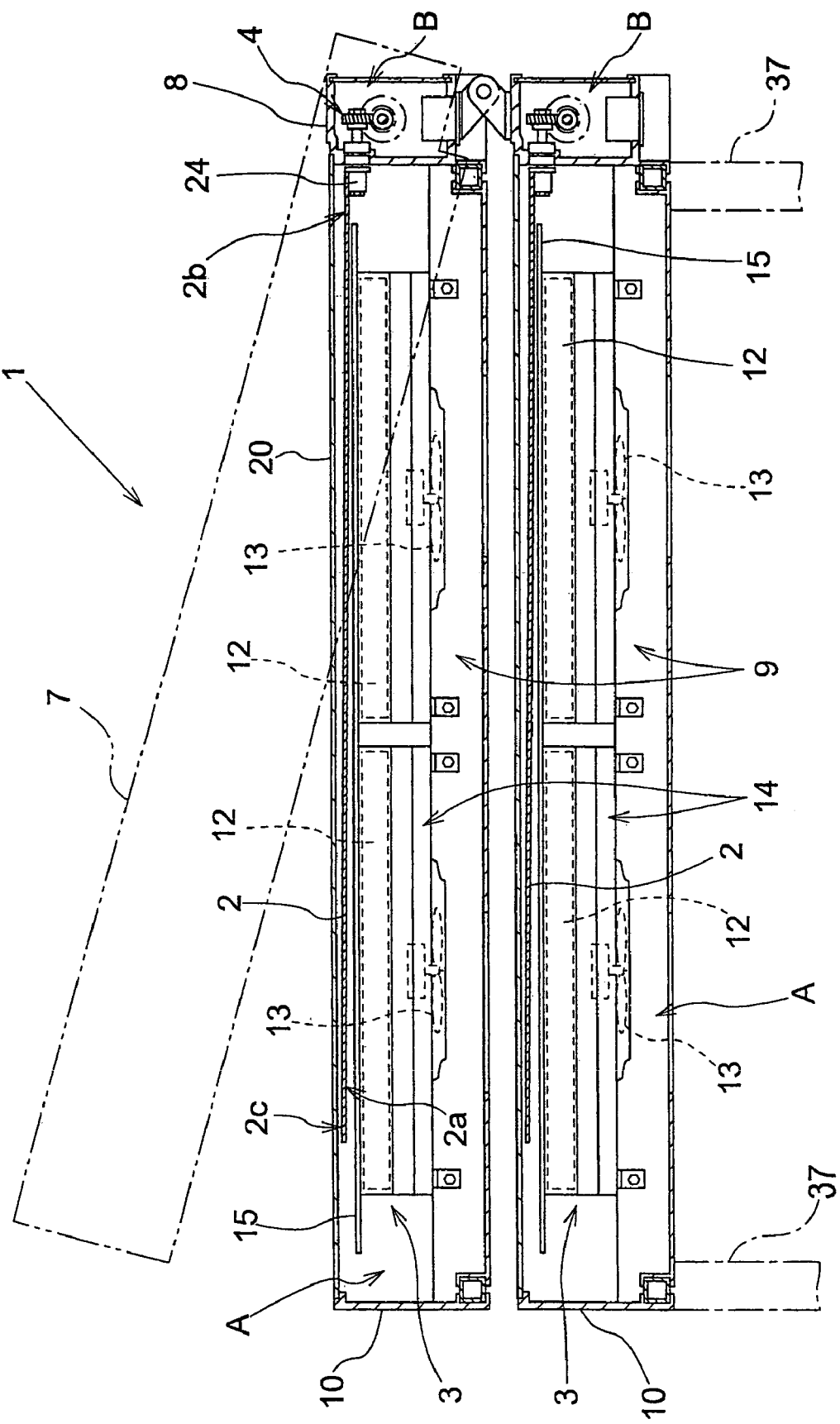
FIG. 14 is a front sectional view of the transporting unit according to the third embodiment.

That is, as shown in FIG. 14, the casing member 7 is supported horizontally by the horizontal support member 37 when viewed in the transporting direction. And because of the casing member 7 being supporting in a horizontal state, the air-supplying-type support means 3 is also supported on the unit frame member 9 in a horizontal orientation. Consequently, the air rectifying plate 15 that is provided in the width direction on the air-supplying-type support means 3 also is provided in a horizontal orientation when viewed from the transporting direction. In other words, the entire transporting unit 1, including the air-supplying-type support means 3, is provided in a horizontal state.

Of the six blower fans 13 provided in the air-supplying-type support means 3, the three blower fans 13 positioned on the side in the width direction on which the drive force application means 4 is provided are driven at a slower rotation velocity than the three blower fans 13 positioned on the opposite side, such that the three blower fans 13 positioned on the opposite side supply a greater amount of air. Also, the air rectifying plate 15 is provided at the same distance from the two blower fans lined up in the width direction from the perspective of the transporting direction. That is, the air-supplying-type support means 3 is provided such that the distal end side 2c in the width direction is supplied with more purified air than the drive side 2b so that the glass substrate 2 is supported in a sloped orientation.

Figure 15:
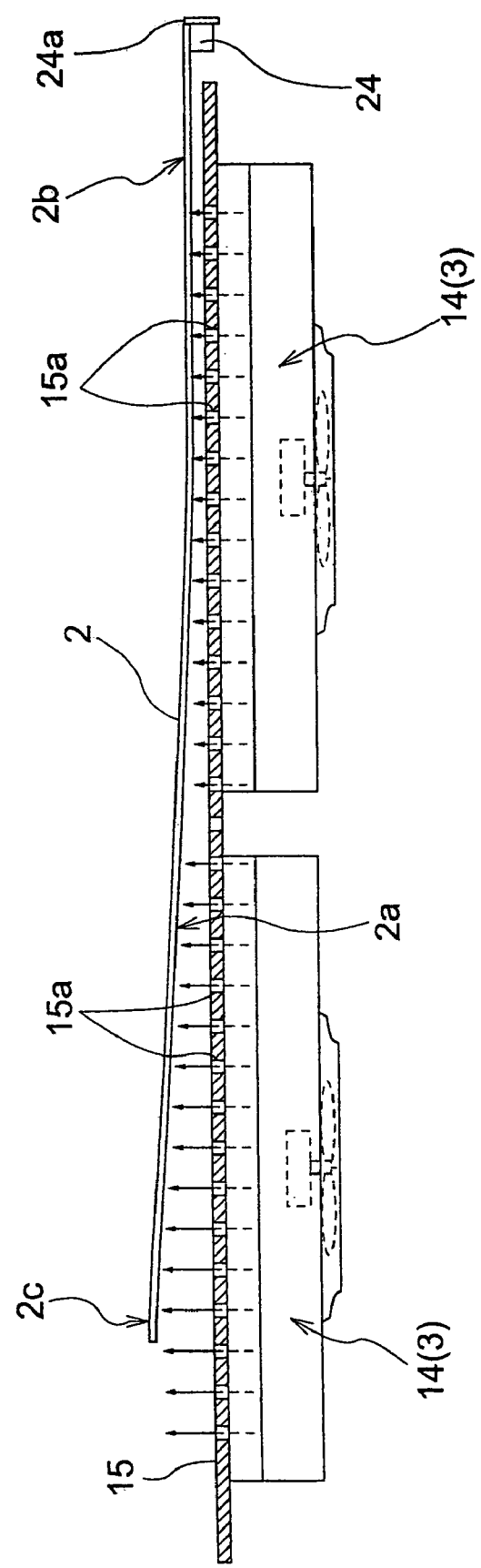
FIG. 15 is an action diagram showing how the glass substrate is supported in a sloped orientation in the third embodiment.

That is, as shown in FIG. 15, a larger amount of purified air is supplied to the distal end side 2c than the drive side 2b of the glass substrate 2 to raise the distal end side 2c significantly higher than the drive side 2b of the glass substrate 2, putting the glass substrate 2 into a sloped orientation.

Consequently, in the same way as in the first embodiment, the movement of the glass substrate 2 toward the one side in the width direction is restricted by the large diameter portion 24a of the drive rollers 24, and because its own weight makes it unlikely that the glass substrate 2 will move toward the distal end side in the width direction of the glass substrate 2, it is possible to prevent the glass substrate 2 from shifting in the width direction or from tilting in the transporting direction when the glass substrate 2 is stopped after transporting has finished, for example. Further, the glass substrate 2 pushes against the drive rollers 24 due to its own weight, and thus the glass substrate 2 can be transported with little likelihood of the drive rollers slipping freely.

Fourth Embodiment

A fourth embodiment of a transporting system for transporting a glass substrate for liquid crystal as a transported object is described below with reference to the drawings. Structural components that are identical to those of the first embodiment are assigned same reference numerals and description thereof is omitted.

Figure 16:
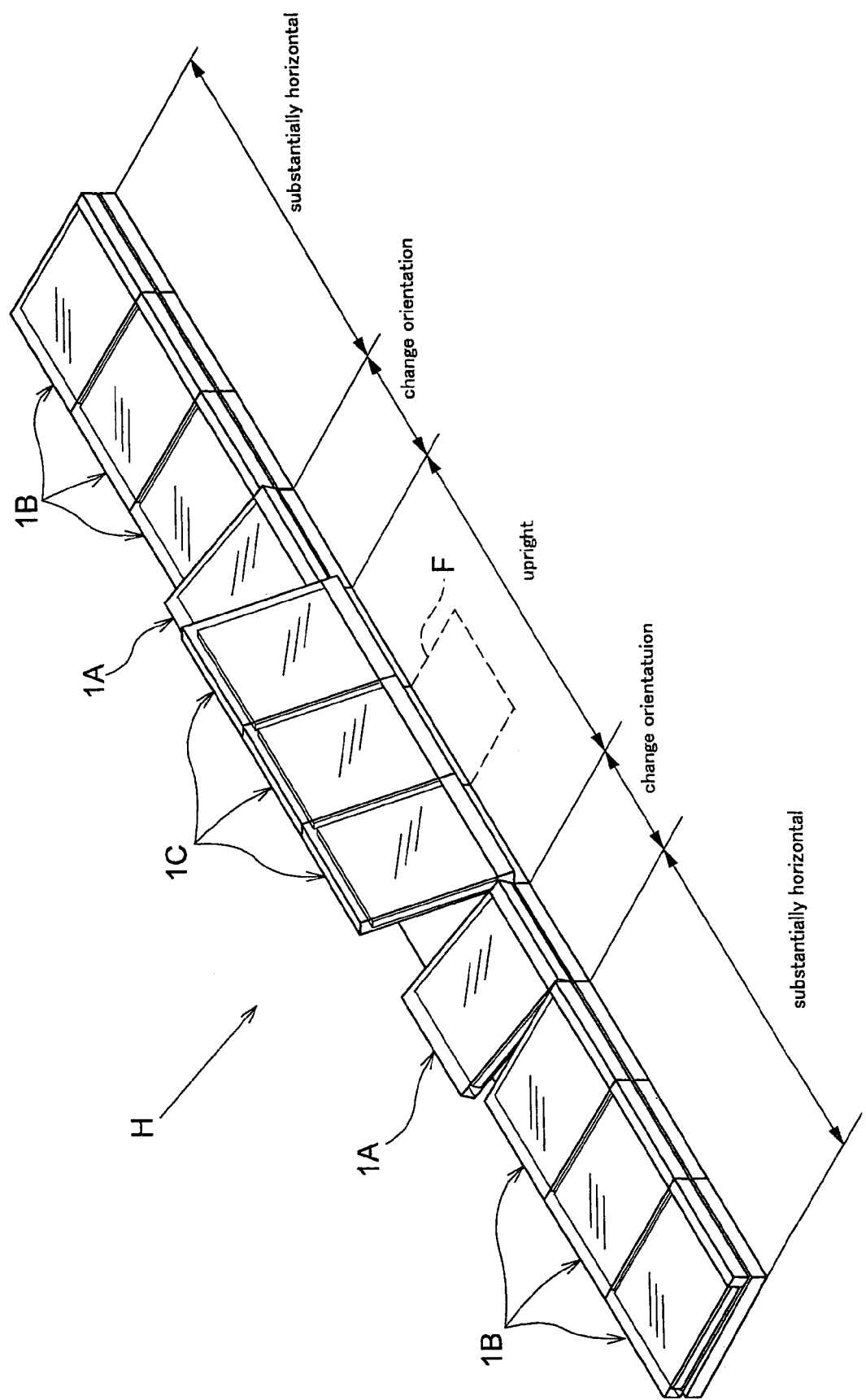
FIG. 16 is a perspective view of the transporting system according to the fourth embodiment.

As shown in FIG. 16, a transporting system H is provided with an upright transporting unit 1C for transporting the glass substrate 2 in an upright orientation, horizontal transporting unit 1B provided on both the upstream and downstream sides of the upright transporting unit 1 that is for transporting the glass substrate 2 in a substantially horizontal orientation, and an reorientable transporting unit 1A for transferring glass substrates 2 between the horizontal transporting units 1B and the upright transporting unit 1C.

That is, a transporting means 6a (hereinafter, referred to as the reorientable transporting means 6a) of the reorientable transporting unit 1A is configured such that it can be altered between a horizontal transport state in which the glass substrate 2 is supported in a substantially horizontal orientation and an upright transport state in which the glass substrate 2 is supported in an upright orientation. When this is changed to the horizontal transport state, glass substrates 2 can be carried between horizontal transporting units 1B in a substantially horizontal state. When the reorientable transporting means 6a is changed to the upright transport state, then glass substrates 2 can be carried between horizontal transporting units 1B and the upright transporting unit 1C in an upright orientation. An inspection area F for inspecting glass substrates 2 that are carried by the upright transporting unit 1C for scratches or cracking, for example, is formed to the side of the upright transporting unit 1C.

In other words, a transporting apparatus that is configured such that it can be altered between a horizontal transport state in which the reorientable transporting means 6a supports the glass substrate 2 in a substantially horizontal orientation and an upright transport state in which the reorientable transporting means 6a supports the glass substrate 2 is an upright orientation is the reorientable transporting unit 1A, whereas a transporting apparatus whose carry orientation is fixed that supports the glass substrate 2 in a substantially horizontal orientation is a horizontal transporting unit 1B, and a transporting apparatus whose carry orientation is fixed that supports the glass substrate 2 in an upright orientation is the upright transporting unit 1C.

Figure 29:
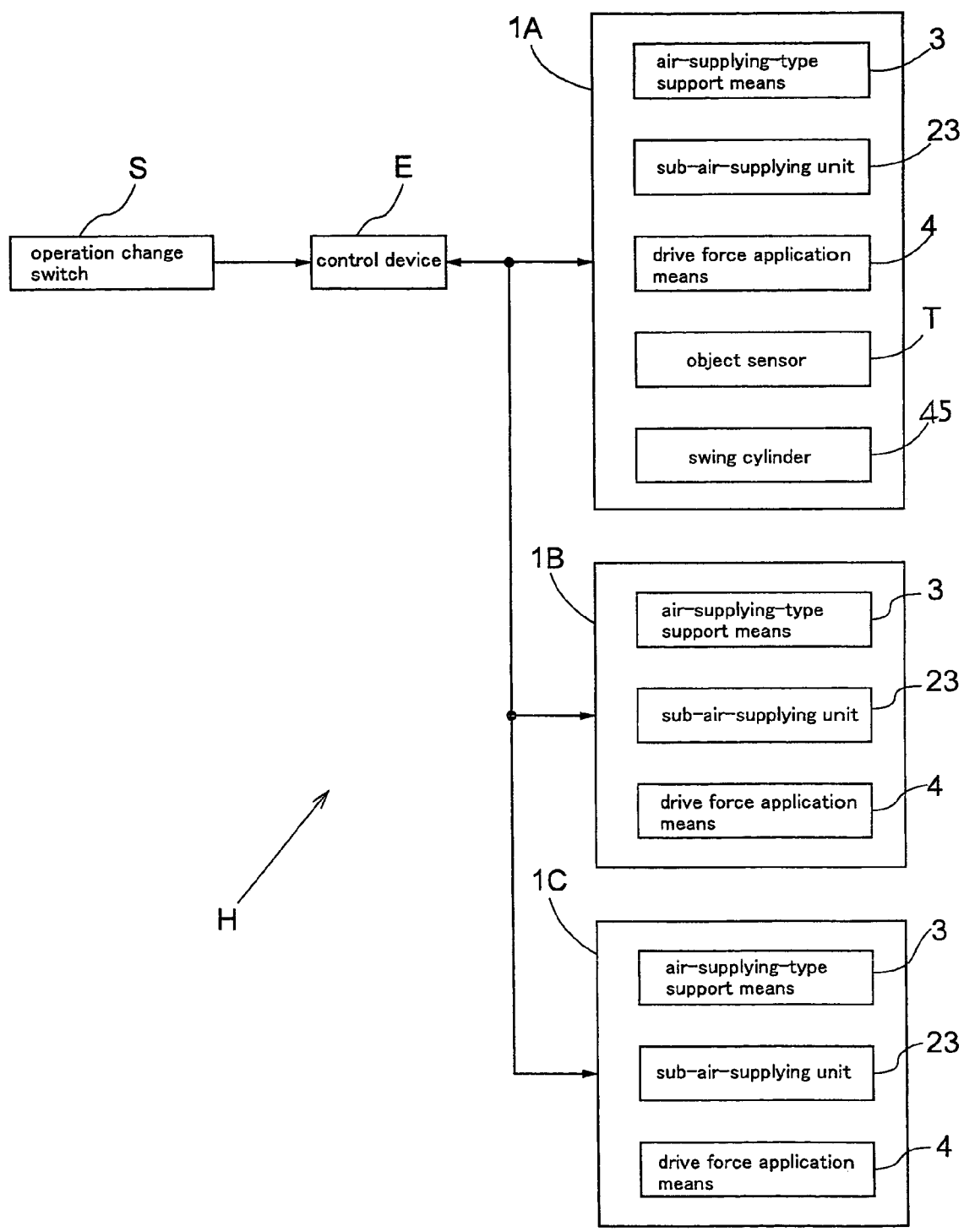
FIG. 29 is a control block diagram of the transporting system according to the fourth embodiment.

Also, as shown in FIG. 29, the transporting system H is provided with a manually operated operation change switch S for ordering operation start, operation stop, and carry stop of the transporting system H, and a control device E for controlling operation of the reorientable transporting unit 1A, the horizontal transporting units 1B, and the upright transporting unit 1C based on commands from the operation change switch S.

Figure 17:
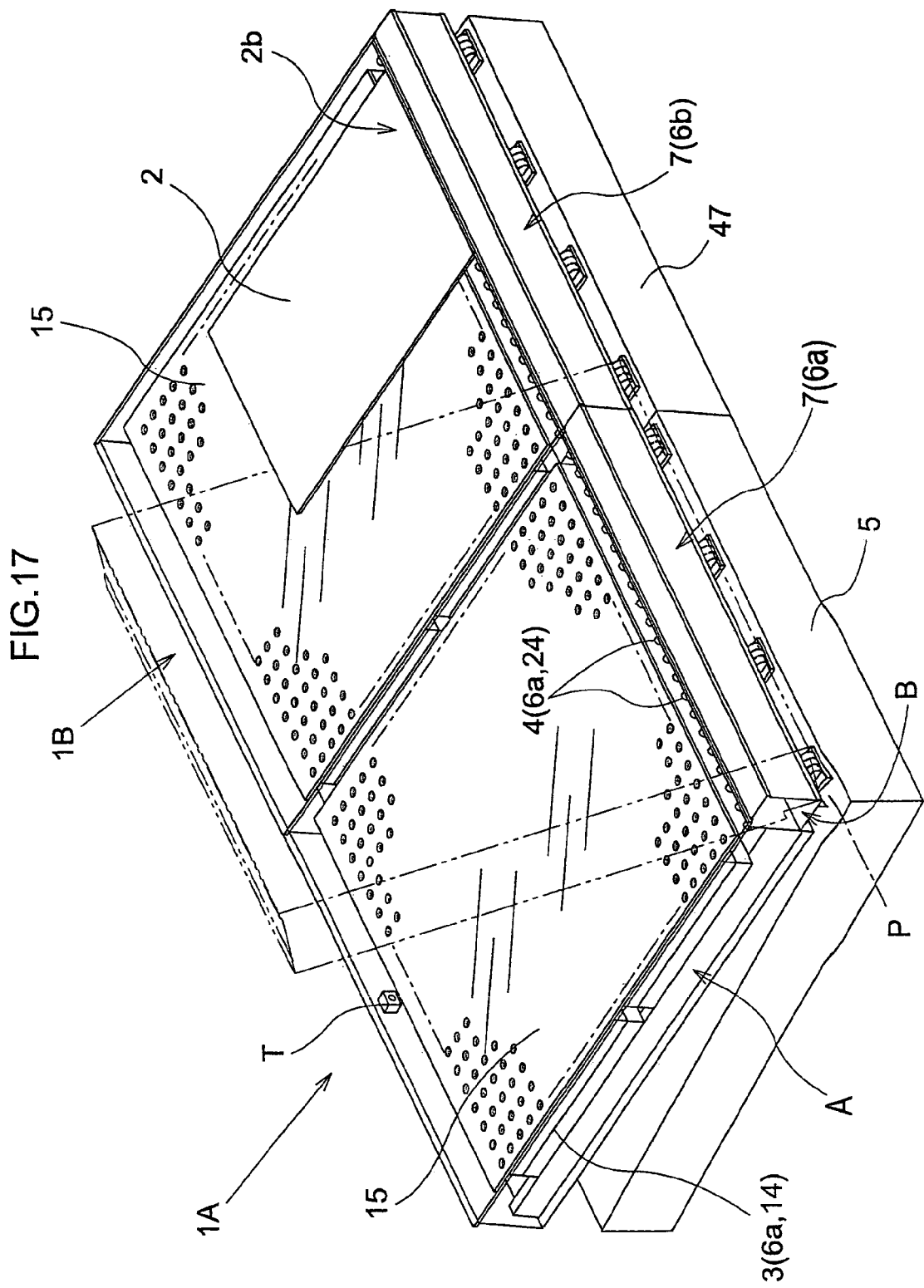
FIG. 17 is a perspective view of the transporting unit for changing orientation according to the fourth embodiment.
Figure 18:
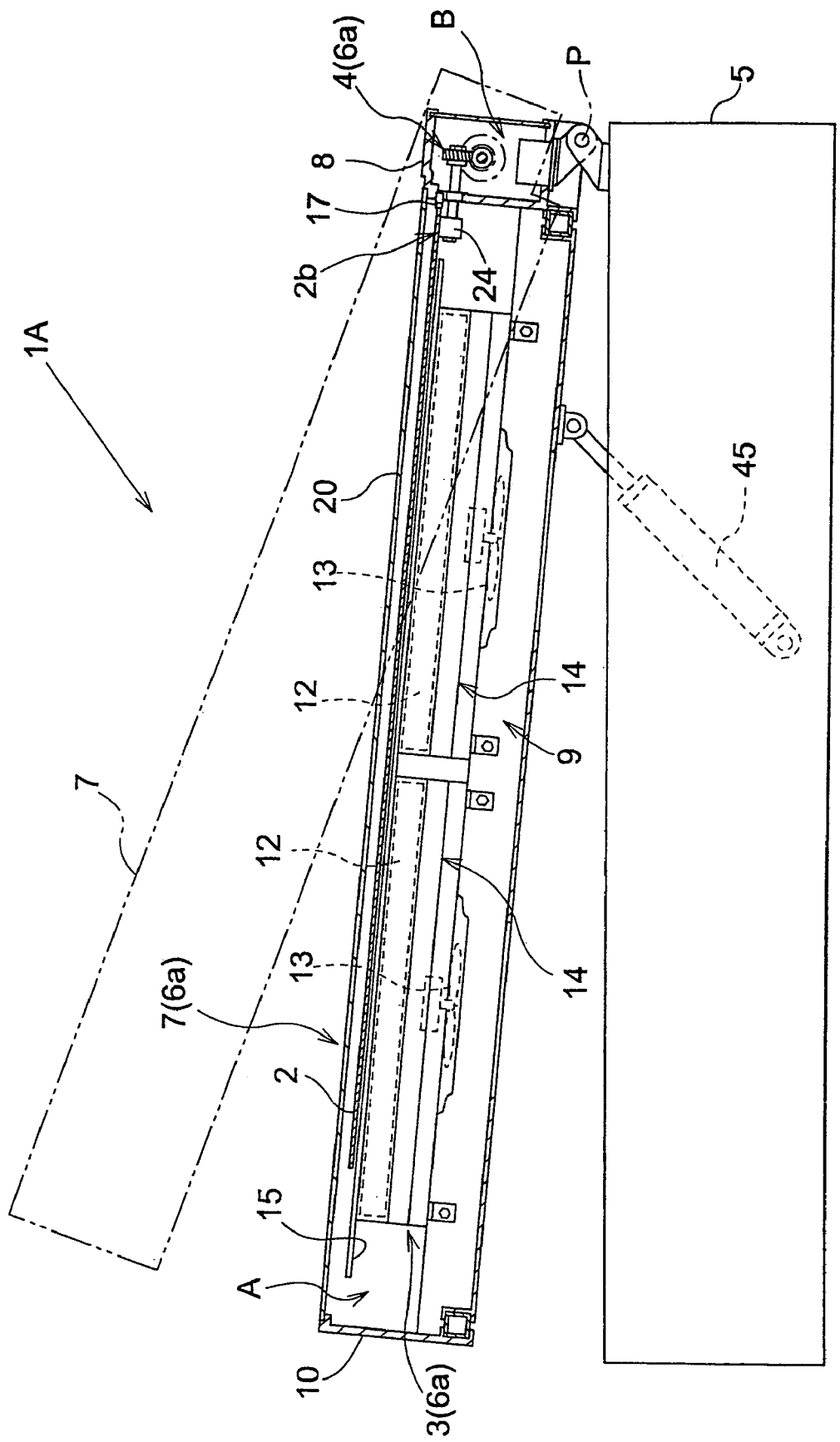
FIG. 18 is a rear view of the transporting unit for changing orientation according to the fourth embodiment.
Figure 19:
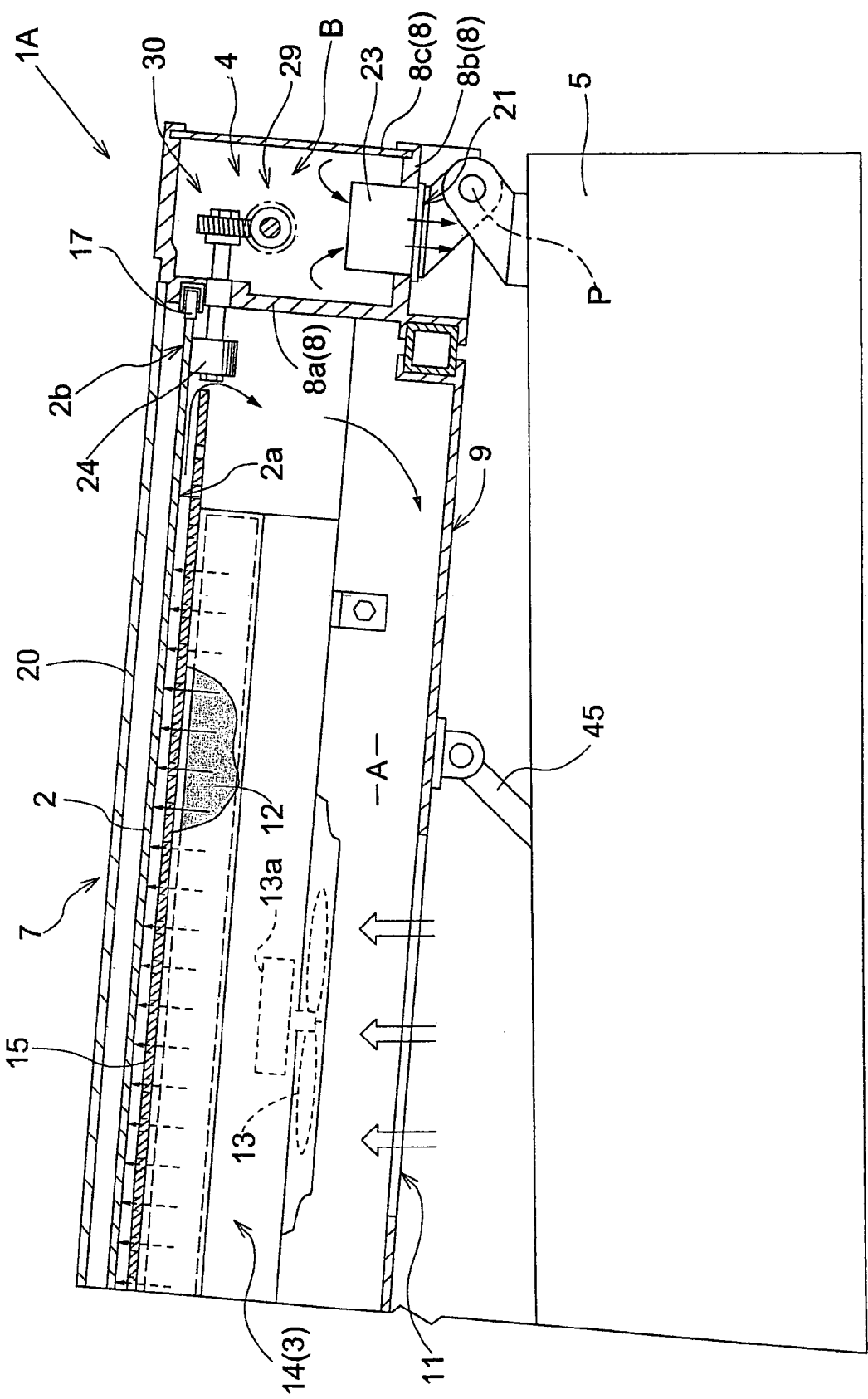
FIG. 19 is a partially magnified view of the transporting unit for changing orientation according to the fourth embodiment.

The reorientable transporting unit 1A is described below. As shown in FIGS. 17 to 19, the reorientable transporting unit 1A is made of the reorientable transporting means 6a and a support frame member 5 for supporting the reorientable transporting means 6a. The reorientable transporting means 6a is connected to and supported on the support frame member 5 in such a manner that by swinging about a transverse shaft P extending in the transporting direction, that is positioned on one end side in the width direction, it can be altered between a horizontal transport state in which the glass substrate 2 is supported in a substantially horizontal orientation and an upright transport state in which the glass substrate 2 is supported in an upright orientation.

Figure 27:
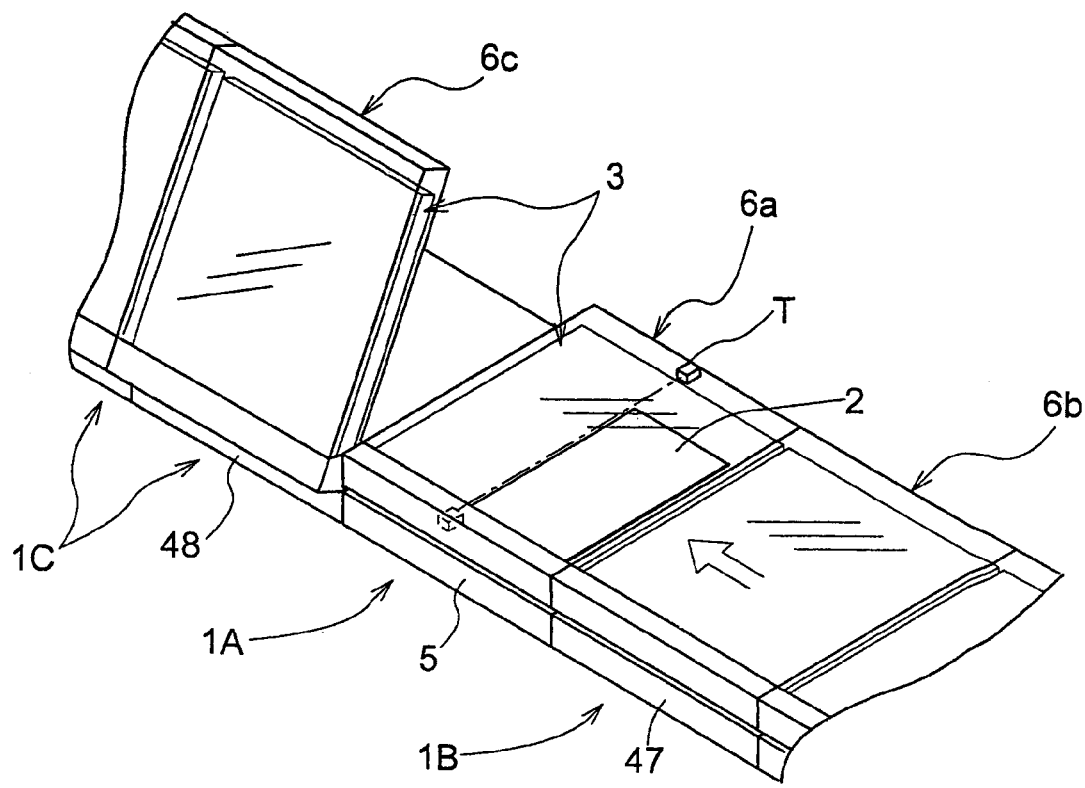
FIG. 27 is a diagram showing how the glass substrate is transferred from the horizontal transporting unit to the transporting unit for changing orientation in the fourth embodiment.
Figure 28:
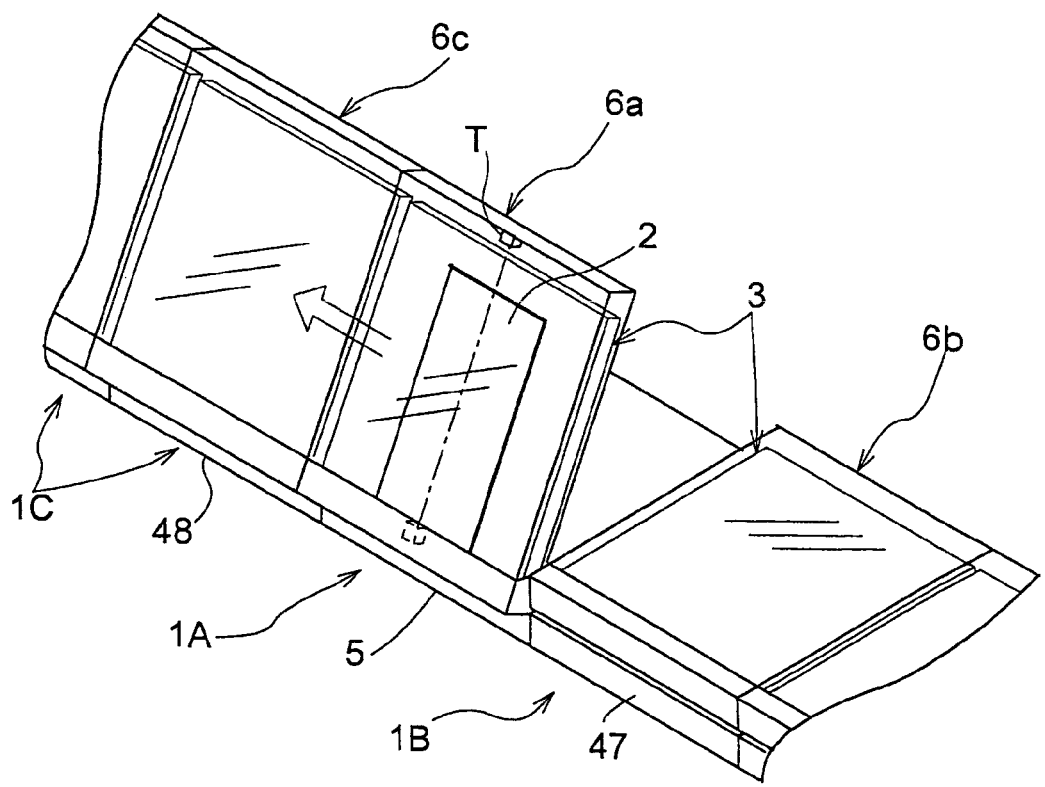
FIG. 28 is a diagram showing how the glass substrate is transferred from the transporting unit for changing orientation to the upright transporting unit in the fourth embodiment.

The reorientable transporting means 6a, like the apparatus of the first embodiment, is provided with air-supplying-type support means 3 for supplying purified air toward a lower surface 2a of the glass substrate 2 to contactlessly support the glass substrate 2 in a substantially horizontal orientation, drive force application means 4 for applying a drive force in the transporting direction to the glass substrate 2, which is supported by the air-supplying-type support means 3, and a casing member 7 in which the air-supplying-type support means 3 and the drive force application means 4 are accommodated. Also, the drive force application means 4 is a single-side driving means for applying a drive force to only one end side in the width direction, which is perpendicular to the transporting direction, of the glass substrate 2. Hereinafter, this one end side in the width direction, which is perpendicular to the transporting direction, of the glass substrate 2 is referred to as the drive side 2b. Also, as shown in FIG. 27 and FIG. 28, the reorientable transporting means 6a is provided with an object sensor T for detecting whether the glass substrate 2 is on the transporting route for the glass substrate 2. The object sensor T detects the presence of the glass substrate 2 on the transporting route if light from a light-emitting portion is not received by a light-receiving portion, and it detects that the glass substrate 2 is not on the transporting route when light from the light-emitting portion is received by the light-receiving portion. It should be noted that the number and installation position, for example, of the object sensor T can be changed where necessary, and it is only necessary that the object sensor T is capable of detecting whether or not the entire glass substrate 2 is on the reorientable transporting means 6a.

The casing member 7, the accommodation frame 8, and the transport space A and the accommodation space B are substantially the same as those of the first embodiment, as shown by FIG. 18 and FIG. 19.

Figure 23:
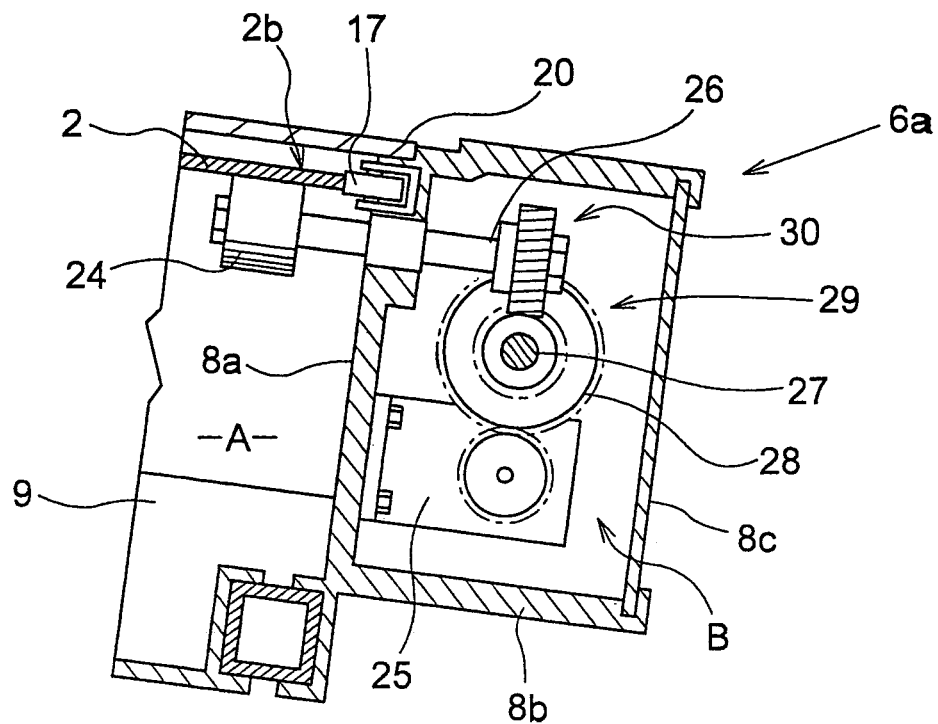
FIG. 23 is a rear view of the drive force application means according to the fourth embodiment.
Figure 24:
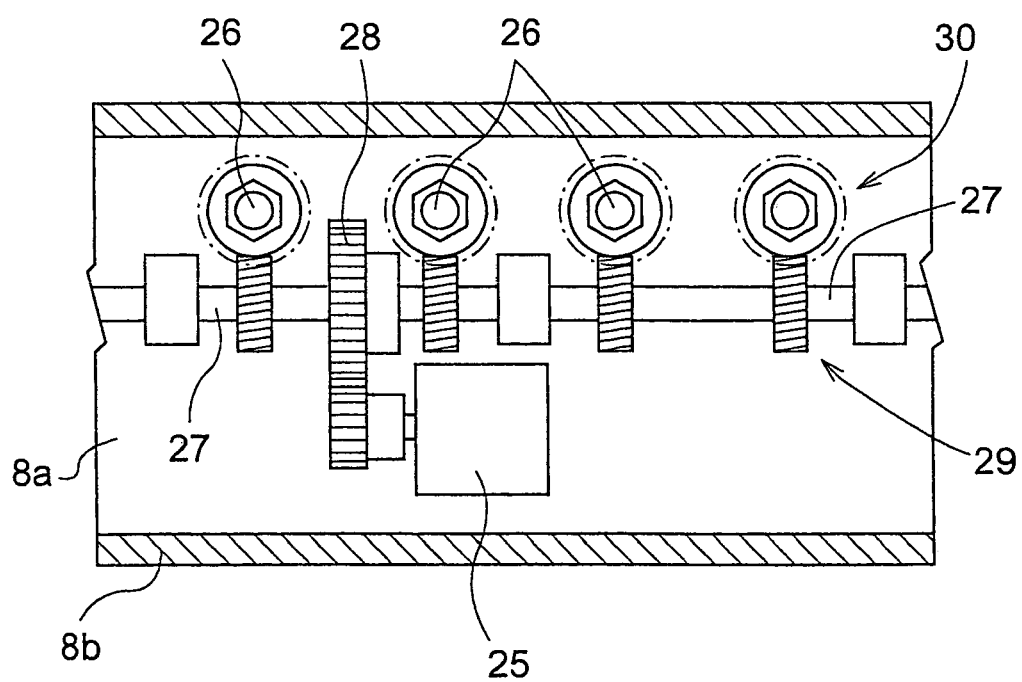
FIG. 24 is a partially magnified view of the drive force application means according to the fourth embodiment.

As shown in FIG. 19 and FIG. 23, restricting and supporting rollers 17 serving as a restricting and supporting member that abuts against the lateral surface of the drive side 2b of the glass substrate 2 to restrict movement of the glass substrate 2 in the width direction when the reorientable transporting means 6a is in the horizontal transport state and to support the glass substrate 2 when the reorientable transporting means 6a is in the upright transport state is provided in the inner wall 8a of the accommodation frame 8. This restricting and supporting roller 17 is configured such that it can freely rotate about a slightly oblique vertical shaft.

Figure 20:
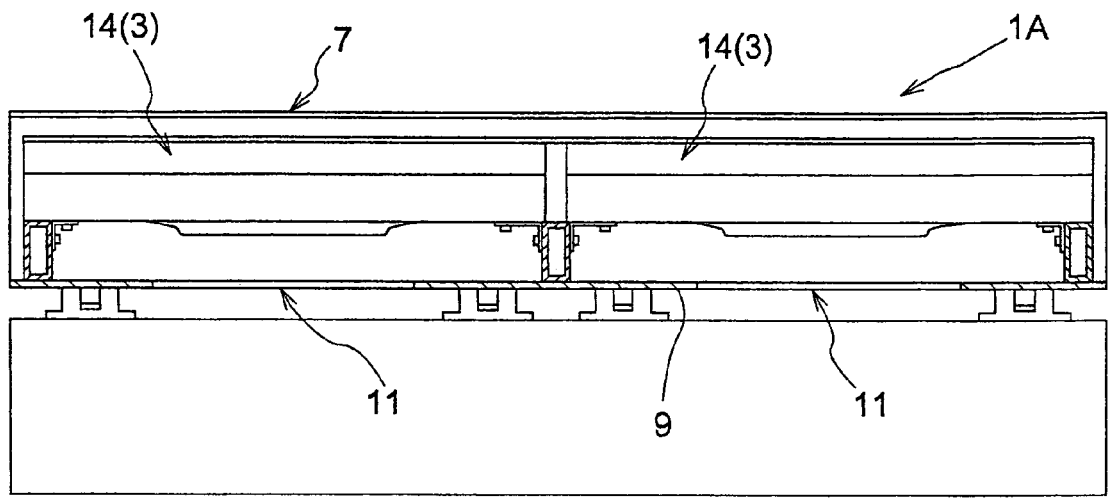
FIG. 20 is a lateral view of the transporting unit for changing orientation according to the fourth embodiment.
Figure 21:
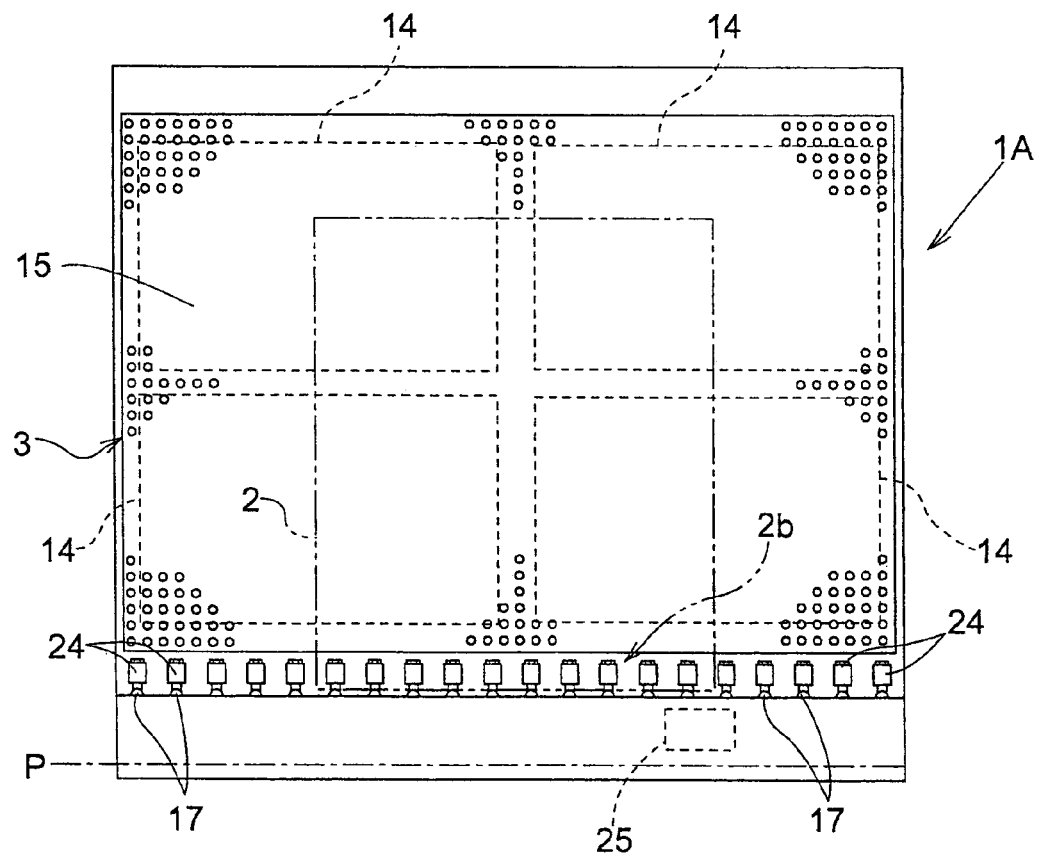
FIG. 21 is a plan view of the transporting unit for changing orientation according to the fourth embodiment.
Figure 22:
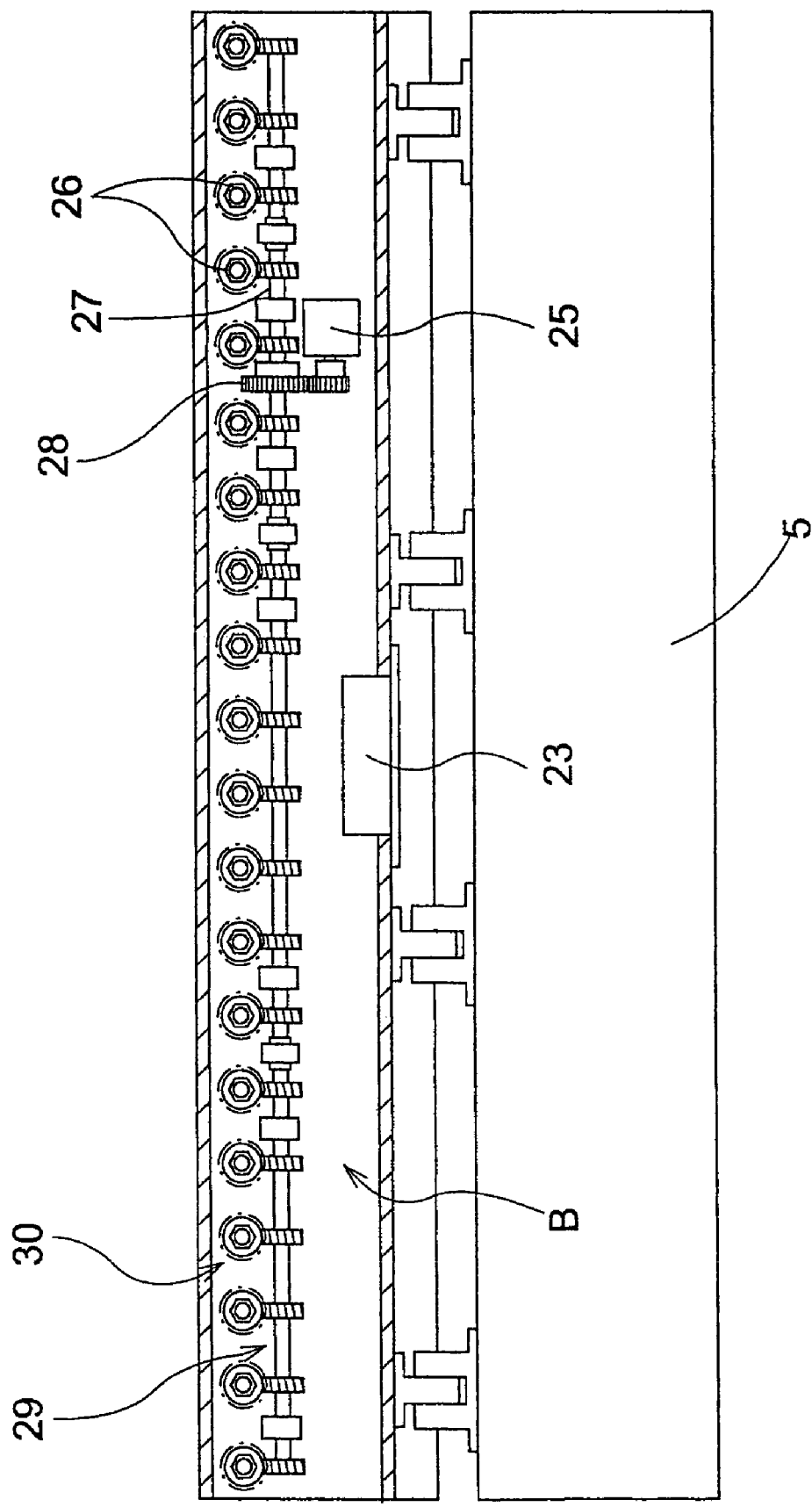
FIG. 22 is a lateral view of the drive force application means according to the fourth embodiment.

The air-supplying-type support means 3 has substantially the same structure as that of the first embodiment, but as shown in FIG. 18, FIG. 20, and FIG. 21, in this embodiment it is provided with a total of four fan filter units 14, these being two fan filter units 14 lined up in the width direction and two fan filter units 14 lined up in the transporting direction. Also, the two air-supplying-type support means 3 lined up in the width direction are configured such that the amount of purified air that is supplied can be changed individually, so that the amount of air supplied by the air-supplying-type support means 3 on the side on which the drive force application means 4 is not present is greater than that of the air-supplying-type support means 3 on the side on which the drive force application means 4 is present.

An air rectifying plate 15 serving as a blocking member that is positioned above the fan filter units 14 that permits the passage of purified air that has passed through the dust removal filter 12 and that performs blocking such that foreign objects are prevented from falling toward the dust removal filter 12 is provided covering the area above the four fan filter units 14 as shown in FIG. 17 and FIG. 21. In other words, the air-supplying-type support means 3 is made of four fan filter units 14 and a single air rectifying plate 15. Also, the blower fans 13 are rotated by an electric motor 13a that is furnished therein.

Figure 25A:
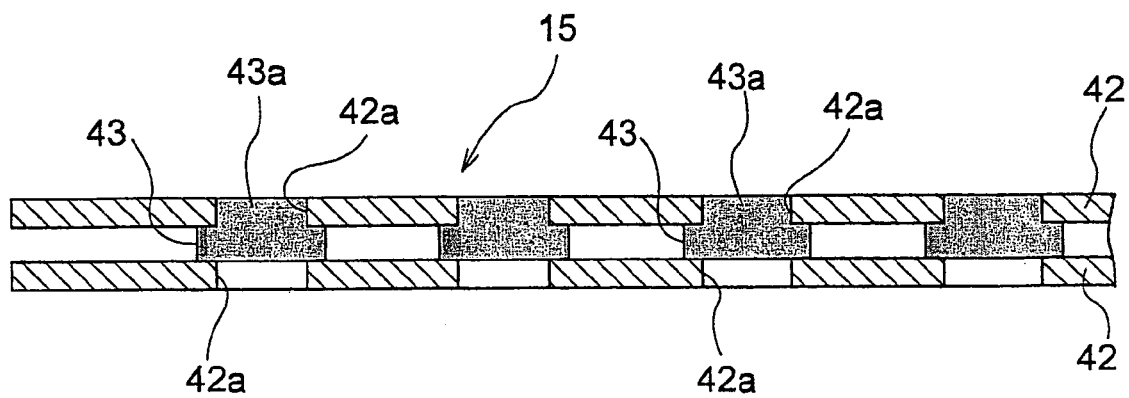
FIG. 25 is a diagram showing the air rectifying plate according to the fourth embodiment.
Figure 25B:
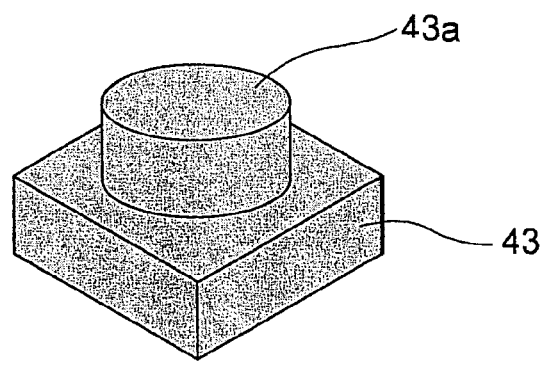
Figure 25C:
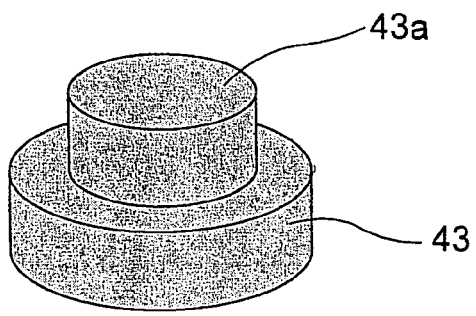

As shown in FIG. 25, the air rectifying plate 15 according to this embodiment is provided with porous members 42 that allow the passage of purified air that has passed through the dust removal filter 12, and numerous filters 43 such as those shown in FIG. 25B or FIG. 25C that are positioned on the dust removal filter 12 side of the porous members 42. Numerous through holes 42a are formed in the porous members 42 by punching, and each filter 43 is provided sandwiched between the two similarly structured porous members 42 and a projecting portion 43a thereof is fitted into one of the through holes 42a of the upper porous member 42 to prevent shifting in the width direction.

The drive force application means 4 of the present embodiment is described next, and as shown in FIGS. 19 and 22 to 24, the drive force application means 4 is a single-side driving means that is provided with drive rollers 24 as contact-type drive portions for applying a drive force to support the drive side 2b of the lower surface 2a of the glass substrate 2 in a contacting manner, and is substantially identical to the drive force application means 4 that is disclosed in the first embodiment.

Figure 26A:
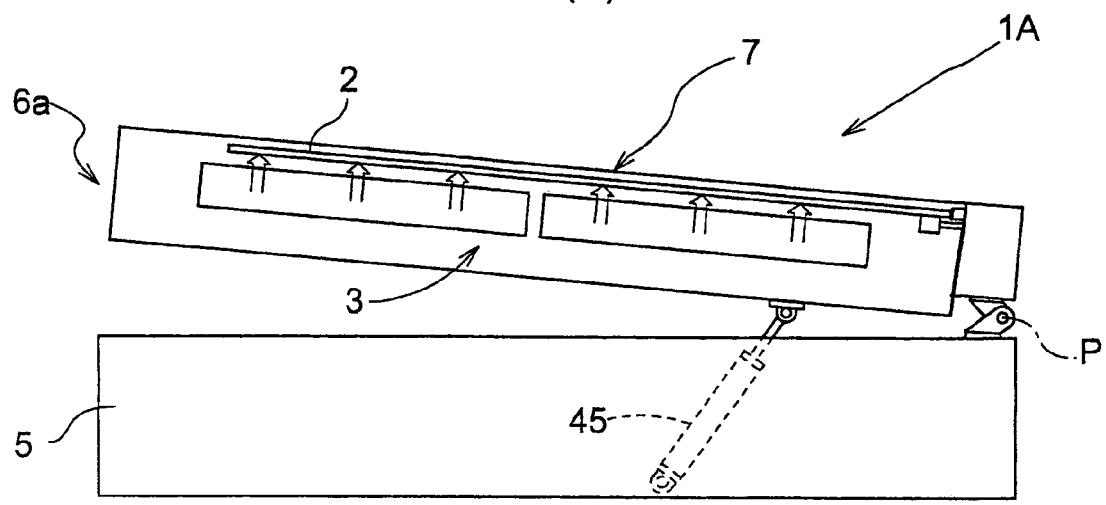
FIG. 26 is a diagram showing the horizontal transport state and the upright transport state of the transporting means for changing orientation according to the fourth embodiment.
Figure 26B:
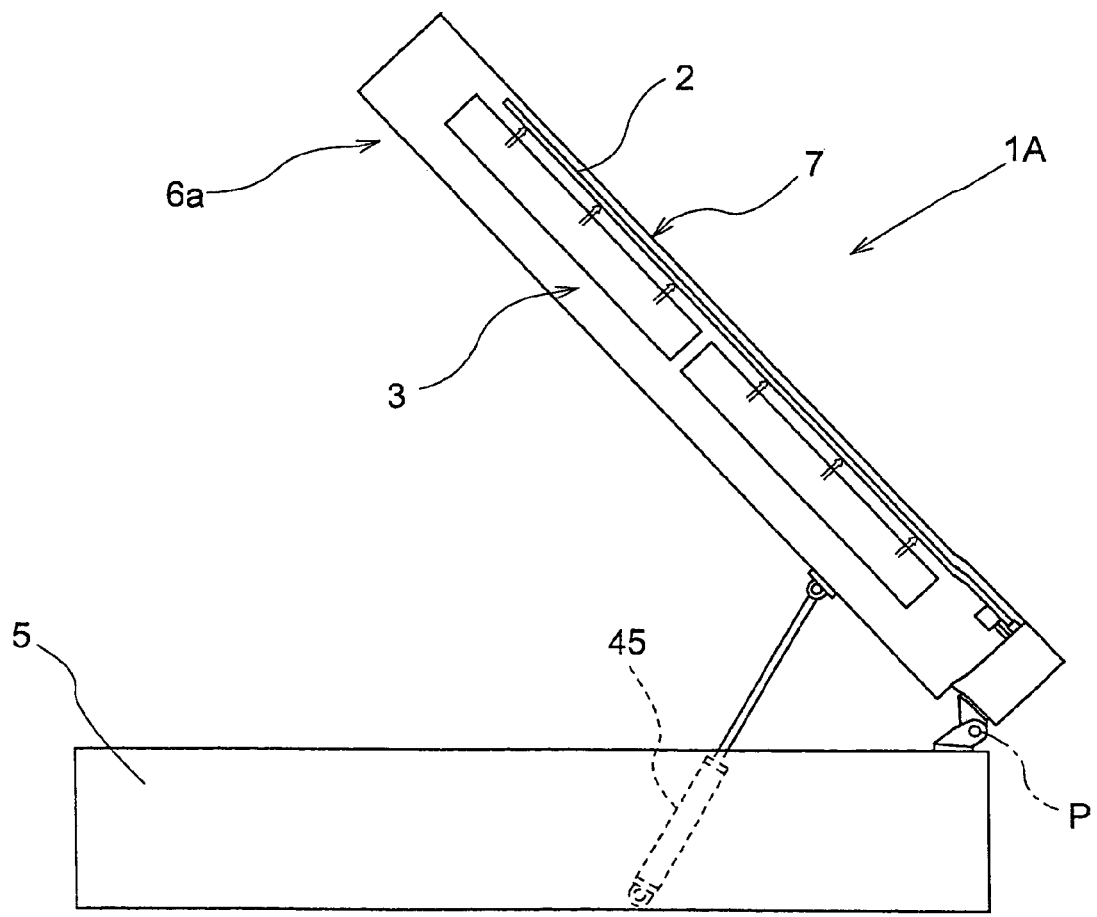

The structure of the reorientable transporting means 6a for changing the orientation between a horizontal transport state and an upright transport state is described next. As shown in FIGS. 26A and 26B, an electric swing cylinder 45 is provided on the support frame member 5, the front end of the swing cylinder 45 is connected to the casing member 7 of the reorientable transporting means 6a, and by extending and shortening the swing cylinder 45 the orientation of the reorientable transporting means 6a can be altered between a slightly sloped horizontal transport state such as that shown in FIG. 26A, in which the side on which the accommodation frame 8 is provided when viewed in the transporting direction is positioned lowest, and an upright transport state such as that shown in FIG. 26B, in which the reorientable transporting means 6a is slightly tilted toward the horizontal transport state from a vertical orientation when viewed in the transporting direction. The swing cylinder 45 is a device that is found in the conventional art, and it has either a hydraulic cylinder or an air cylinder. In place of the swing cylinder 45 it is also possible to furnish a rod having teeth that mesh with an electric motor that has gears to serve as an actuator.

That is, by putting the reorientable transporting means 6a into the horizontal transport state, the air-supplying-type support means 3 comes to be in a substantially horizontal state, and the glass substrate 2 that is supported by the air-supplying-type support means 3 is supported in a substantially horizontal orientation. Also, by putting the reorientable transporting means 6a into the upright transport state, the air-supplying-type support means 3 also is comes to be in an upright state, and the glass substrate 2 that is supported by the air-supplying-type support means 3 is supported in an upright orientation.

Also, as the angle of the reorientable transporting means 6a is increased as the orientation of the reorientable transporting means 6a is changed from the horizontal transport state to the upright transport state, the amount of purified air that is supplied toward the lower surface 2a of the glass substrate 2 by the air-supplying-type support means 3 is decreased by the control device E. Further, as the angle of the reorientable transporting means 6a is decreased as the orientation of the reorientable transporting means 6a is changed from the upright transport state to the horizontal transport state, the amount of purified air that is supplied toward the lower surface 2a of the glass substrate 2 by the air-supplying-type support means 3 is increased by the control device E.

Consequently, in the horizontal transport state, a large amount of purified air is supplied to substantially the entire region of the lower surface 2a of the glass substrate 2 by the air-supplying-type support means 3 so as to stably support the glass substrate 2, and in the upright transport state, a small amount of purified air is supplied to substantially the entire region of the lower surface 2a of the glass substrate 2 by the air-supplying-type support means 3, allowing the glass substrate 2 to be supported without it raising up too much.

Transporting of the glass substrate 2 is described next. In both the horizontal transport state and the upright transport state substantially the entire lower surface 2a is supported by the air-supplying-type support means 3, and due to the drive force application means 4, the lower surface 2a on the drive side 2b of the glass substrate 2 is supported in a contacting manner by the drive rollers 24. Furthermore, the transported object can be contactlessly supported by the air-supplying-type support means 3 even during changing from the horizontal transport state to the upright transport state or during changing from the upright transport state to the horizontal transport state.

The drive rollers 24 are rotatively driven by the electric motor 25a to apply a drive force in the transporting direction to the drive side 2b and thereby carry the glass substrate 2.

In both the horizontal transport state and the upright transport state, the glass substrate 2 is supported in a sloped orientation by the air-supplying-type support means 3, and due to its own weight the glass substrate 2 wants to move toward the side on which the drive force application means 4 is provided, which is the side sloped downward in the width direction, but movement of the glass substrate 2 is stopped by the restricting and supporting roller 17. Consequently, movement toward the one side in the width direction of the glass substrate 2 is restricted by the restricting and supporting roller 17, and due to its own weight the glass substrate 2 does not easily move toward the distal end side in the width direction of the glass substrate 2, and thus it is possible to prevent shifting of the glass substrate in the width direction or from tilting away from the transporting direction when movement of the glass substrate 2 has stopped after transporting has finished, for example.

As shown in FIG. 27, the glass substrate 2 can be carried to the reorientable transporting unit 1A from the horizontal transporting unit 1B upstream or downstream of the reorientable transporting unit 1A by changing the reorientable transporting means 6a of the reorientable transporting unit 1A to the horizontal transport state. Also, as shown in FIG. 28, the glass substrate 2 can be carried from the reorientable transporting unit 1A to the upright transporting unit 1C provided upstream or downstream of the reorientable transporting unit 1A by changing the reorientable transporting means 6a of the reorientable transporting unit 1A to the upright transport state.

The horizontal transporting unit 1B and the upright transporting unit 1C are described next. The horizontal transporting unit 1B is fixedly supported on the horizontal support frame member 37 in a slightly sloped horizontal transport state such that when viewed in the transporting direction the side of a horizontal transporting means 6b on which the accommodation frame 8 is provided is positioned lower. The upright transporting unit 1C is fixedly supported in an upright transport state in which when viewed in the transporting direction a sloped transporting means 6c is slightly tilted toward the horizontal transport state from a vertical orientation. It should be noted that the reorientable transporting means 6a, the horizontal transporting means 6b, and the upright transporting means 6c are made of similarly configured transporting means, and the reorientable transporting means 6a is provided with an object sensor T.

The control device E is described below. As shown in FIG. 29, the control device E is configured such that it controls operation start, operation stop, and transport stop for the transporting system H based on commands from the operation change switch S. That is, when the control device E receives an operation start command from the operation change switch S, it activates the air-supplying-type support means 3, the sub-air-supplying units 23, and the drive force application means 4 in each of the reorientable transporting unit 1A, the horizontal transporting unit 1B, and the upright transporting unit 1C to start operation of the transporting system H. Also, when the control device E receives an operation stop command from the operation change switch S, it stops actuation of the air-supplying-type support means 3, the sub-air-supplying units 23, and the drive force application means 4 in each of the reorientable transporting unit 1A, the horizontal transporting unit 1B, and the upright transporting unit 1C so as to stop operation of the transporting system H. Further, when a carry stop command is received from the operation change switch S, the control device E stops actuation of the drive force application means 4 while continuing actuation of the air-supplying-type support means 3 in each of the reorientable transporting unit 1A, the horizontal transporting unit 1B, and the upright transporting unit 1C so as to stop transporting of the glass substrate 2 with the transporting system H.

When the control device E has received an operation start command from the operation change switch S, then, based on the results of detection by the object sensor T, in the reorientable transporting unit 1A it changes the amount of purified air that is supplied by the air-supplying-type support means 3, starts or stops operation of the drive force application means 4, or extends or shortens the swing cylinder 45, and in the horizontal transporting unit 1B and the upright transporting unit 1C, it starts or stops operation of the drive force application means 4.

It should be noted that changing the amount of purified air that is supplied by the air-supplying-type support means 3 is effected by changing the drive velocity of the electric motor 13 in the blower fan 13.

When operation the transporting system H has started, the glass substrate 2 is carried by consecutively transferring it from the upstream horizontal transporting unit 1B to the downstream transporting unit 1B. Then, when the glass substrate 2 is carried further, it is transferred from the horizontal transporting unit 1B on the downstream side to the reorientable transporting unit 1A in the horizontal transport state.

Figure 30:
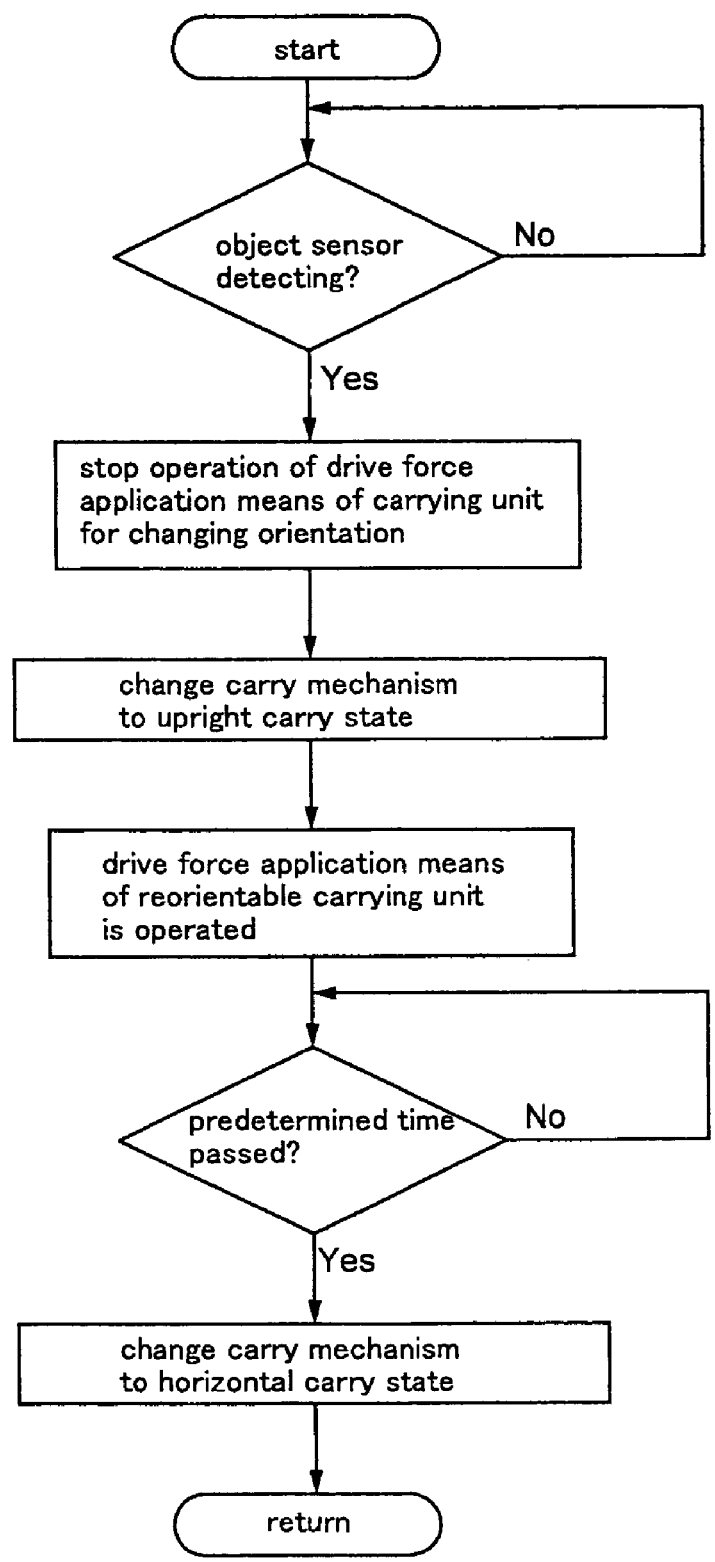
FIG. 30 is a flowchart for the transporting system according to the fourth embodiment.

Hereinafter, the operation of the control device E for controlling operation of the reorientable transporting unit 1A when operation of the carry system H is started after an operation start command is received from the operation change switch S is described with reference to the flowchart shown in FIG. 30. It should be noted that the case of transporting to the upright transporting unit 1C from the horizontal transporting unit 1B by way of the reorientable transporting unit 1A is described below, and description of the case of transporting to the horizontal transporting unit 1B from the upright transporting unit 1C by way of the reorientable transporting unit 1A is omitted.

When the glass substrate 2 has been carried from the horizontal transporting unit 1B to the reorientable transporting unit 1A and the object sensor T is in a detecting state where it detects that the entire glass substrate 2 has been transferred to the reorientable transporting unit 1A, then operation of the drive force application means 4 of the reorientable transporting unit 1A is stopped. The swing cylinder 45 is then extended and the amount of purified air that is supplied by the air-supplying-type support means 3 is reduced so that the reorientable transporting means 6a is in the upright transport state.

When the reorientable transporting means 6a is in the upright transport state, the drive force application means 4 of the reorientable transporting unit 1A is activated in a state where the drive force application means 4 of the upright transporting unit 1C is already activated, to carry the glass substrate 2 from the reorientable transporting unit 1A to the upright transporting unit 1C. Then, when the time from when the drive force application means 4 of the reorientable transporting unit 1A has been activated after the reorientable transporting unit 1A is changed to the upright transport state exceeds a predetermined time required for transferring the entire glass substrate from the reorientable transporting unit 1A to the upright transporting unit 1C, the swing cylinder 45 is shortened and the amount of purified air that is supplied by the air-supplying-type support means 3 is increased so as to set the reorientable transporting means 6a to the horizontal transport state.

It should be noted that when the detection means of the horizontal transporting unit 1B, which is not shown, detects that the glass substrate 2 is being carried by the reorientable transporting means 6a in a state other than the horizontal transport state, the glass substrate 2 is carried up to a forward position where it is near the reorientable transporting unit 1A and operation of the drive force application means 4 of the horizontal transporting unit 1B is stopped, and once the reorientable transporting means 6a has been changed to the horizontal transport state, operation of the drive force application means 4 of the horizontal transporting unit 1B is restarted.

Other Embodiments (1) In the first embodiment, when viewed in the transporting direction the entire transporting unit is in a sloped orientation so as to support the air-supplying-type support means in a sloped orientation, but as shown in FIG. 16, it is also possible to adopt a configuration in which the casing member 7 is supported in a horizontal orientation by the horizontal support member 37 such that the air-supplying-type support means 3 is supported in a sloped orientation on the unit frame member 9 of the casing member 7.

(2) In the first through third embodiments, the drive portion is made of a plurality of drive rollers, but it is also possible to adopt a configuration in which it is made of an endless belt-shaped member such as a timing belt. It should be noted that if the drive portion is made of an endless belt-shaped member, then a series of projecting portions are formed in the action surface of the endless belt-shaped state in the lengthwise direction so that the projecting portions serve as stop portions for the keeping the transported object from moving in the width direction.

Figure 33:
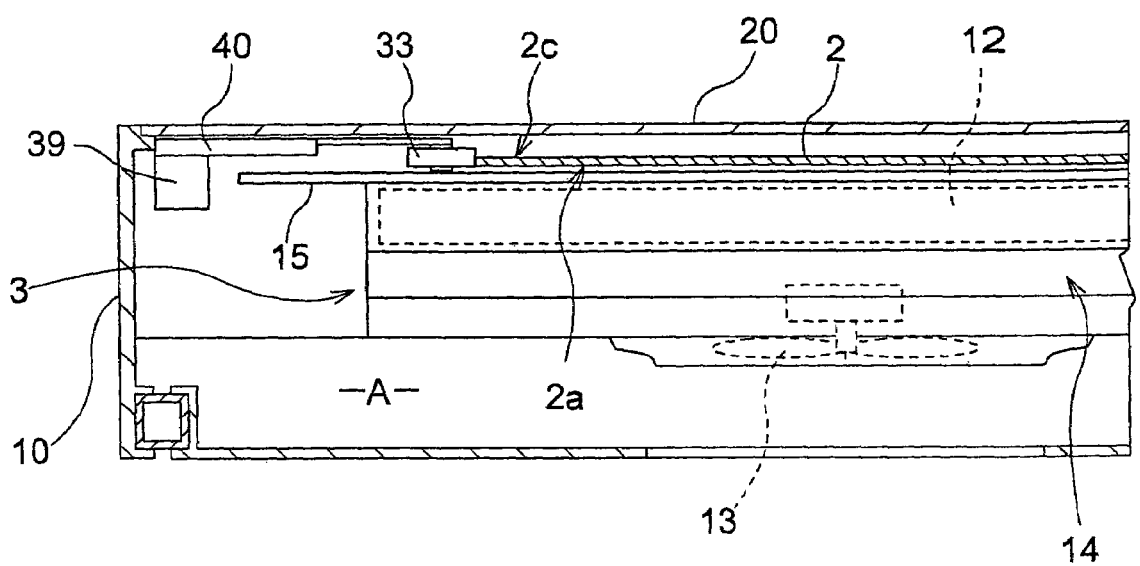
FIG. 33 is a partially magnified front sectional view of the transporting unit in a separate embodiment.

(3) In the second embodiment, the restricting member is made a plurality of restricting rollers, but it is also possible for it to be made of a rotatable endless belt. It is also possible for the restricting member to be supported on the casing member in such a manner that its position in the width direction can be altered. That is, for example, if the restricting member is made of restricting rollers and the restricting rollers are supported on the casing side wall of the casing member, then, as shown in FIG. 33, an electric cylinder 40 is supported on a support frame 39 that is fastened to the casing side wall 10, and the restricting rollers 33 are rotatively supported on the fore end portion of the electric cylinder 40.

(4) In the above embodiments, an example of a blowing unit in which the dust removal filter and the blower fan are combined into a single unit is shown, but it is not absolutely necessary that the dust removal filter and the blower fan are formed as a single unit, and it is also possible to adopt a configuration in which, for example, a guide route or the like for guiding air blown by the blower fan to the dust removal filter is provided and the dust removal filter and the blower fan are configured as separate members.

(5) In the first and third embodiments, the purified air supply portion is tilted by 0.5°, but it is also possible to tilt the purified air supply portion by a smaller or larger angle than this to correspond to the target transported object, for example. It should be noted that in FIGS. 2, 3, 4, 8, and 16, the slope of the purified air supply portion 15 is shown as 5° for the sake of facilitating understanding.

(6) In the fourth embodiment, the transporting system H is configured so as to transfer a glass substrate 2 between the reorientable transporting unit 1A and the transporting unit for upright transporting unit 1B using the reorientable transporting unit 1A, but it is also possible to adopt a transporting line provided with only the reorientable transporting unit 1A.

That is, a transporting line can be made of a plurality of reorientable transporting units 1A lined up in the transporting direction. For example, when transporting thin and easily breakable transported objects, the reorientable transporting units 1A are put into a horizontal transport state in which the transported object is carried in a horizontal orientation or a substantially horizontal orientation to prevent damage to the transported object. And when transporting thick and sturdy transported objects, the reorientable transporting units 1A may be put into an upright transport state in which the transported object is carried in an upright state so as to allow transported objects that are being carried to be viewed easily.

(7) In the case of other embodiment (6), it is also possible to adopt a configuration in which the state of the reorientable transporting means 6a can be altered between three states, namely the horizontal transport state, the upright transport state, and a sloped transport state that is between these two.

Figure 31A:
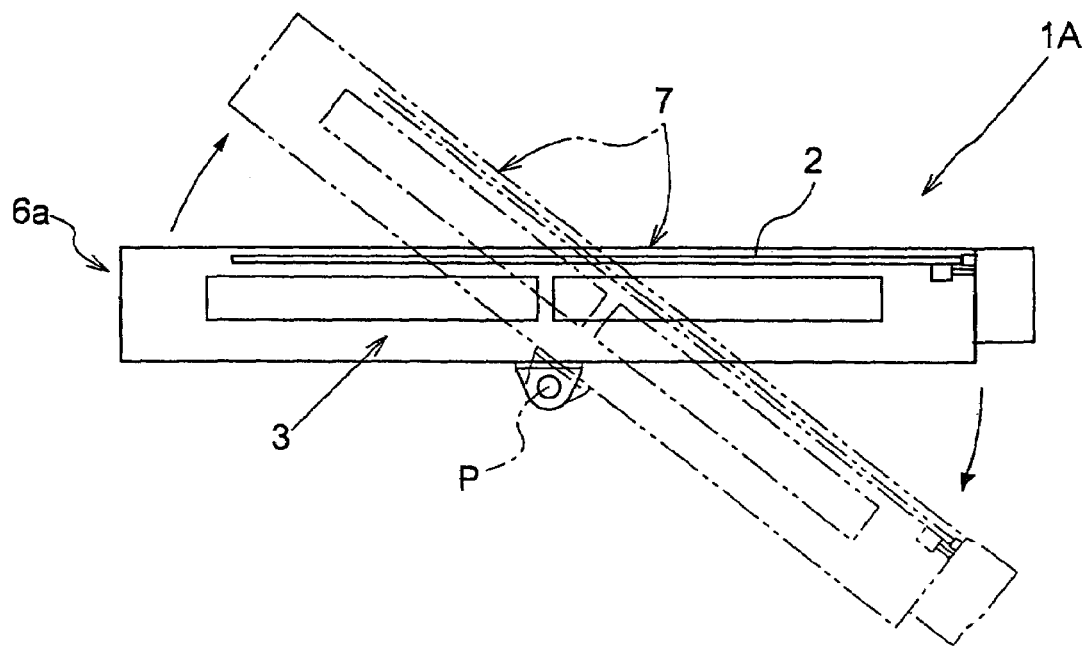
FIG. 31 is a diagram showing a state in which the position of the transverse shaft of the transporting unit for changing orientation according to the fourth embodiment has been changed.
Figure 31B:
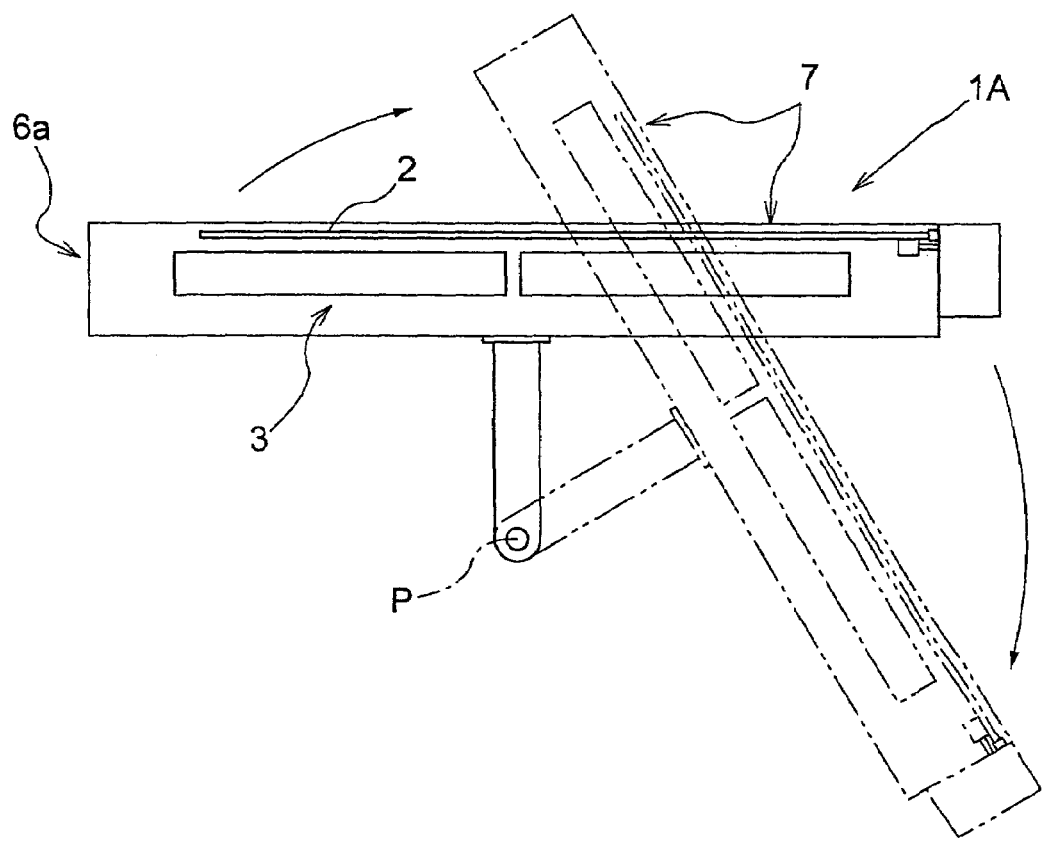
Figure 32:
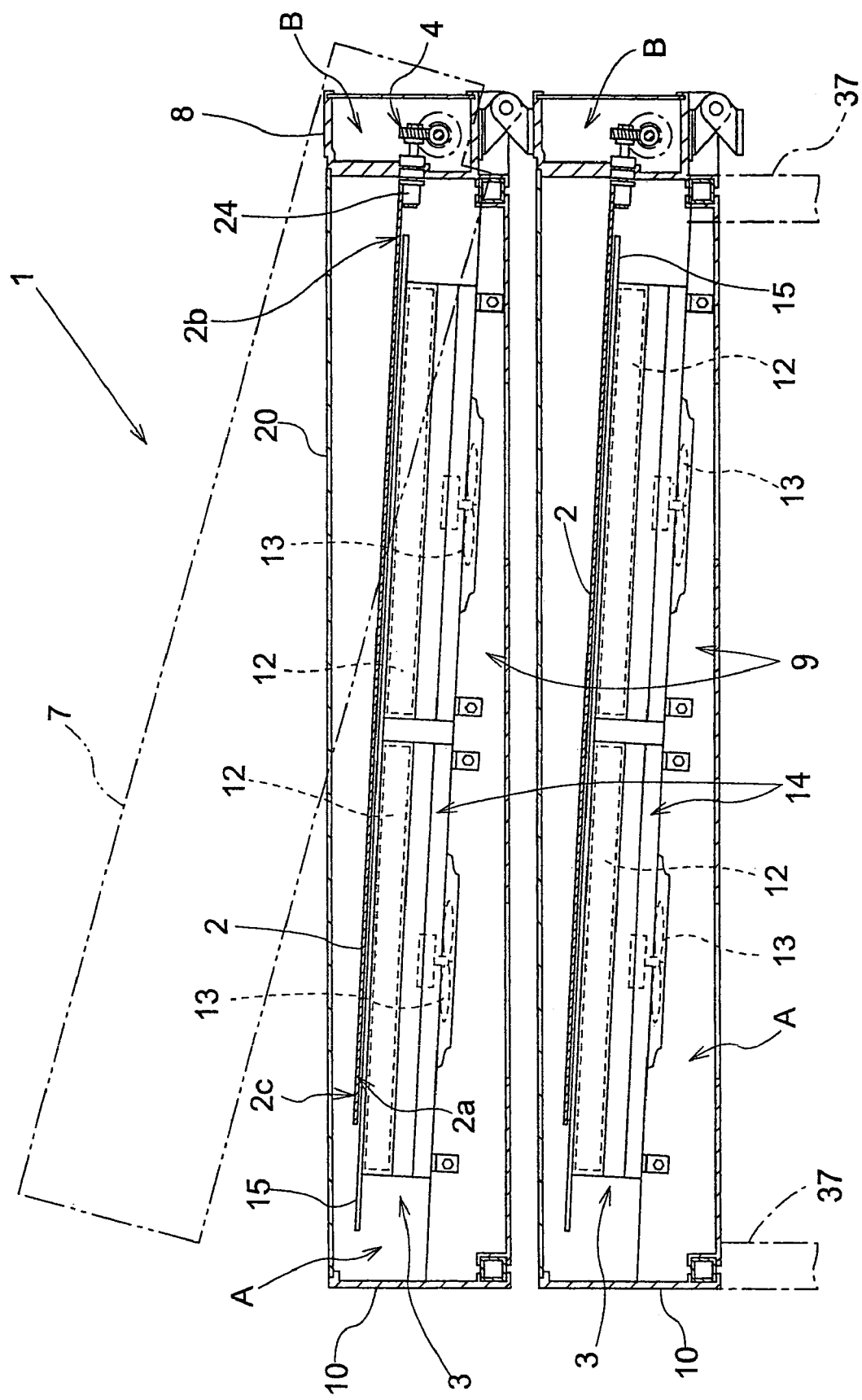
FIG. 32 is a front sectional view of the transporting unit in a separate embodiment.

(8) In the fourth embodiment, the swing shaft P of the reorientable transporting means 6a is positioned on the one end side in the width direction, but there is no limitation to the one end side in the width direction. That is, the swing shaft P of the reorientable transporting means 6a can be positioned in the center in the width direction as shown in FIG. 31A, or it can be positioned at a position that is significantly below the reorientable transporting means 6a as shown in FIG. 31B. By adopting this configuration, it is possible to change the height during the upright transport state or the position in the front to back direction.

It is also possible for the swing shaft P of the reorientable transporting means 6a to be furnished in plurality in the horizontal or vertical directions to increase the ease of use.

(9) In the fourth embodiment, the air-supplying-type support means 3 is made of a plurality of fan filter units 14, each constituted by a dust removal filter 12 and a blower fan 13 combined into a single unit, but it is also possible to adopt a configuration in which the air-supplying-type support means incorporates the dust removal filter 12 and the blower fan 13 individually as separate members.

(10) In the fourth embodiment, the drive portion is made of a plurality of drive rollers 24, but it is also possible to adopt a configuration in which the drive portion is made of an endless belt-shaped member such as a timing belt.

(11) In all the embodiments discussed above, a glass substrate for liquid crystal serves as an example of the transported object, but the transported object may also be a semiconductor wafer, for example, and there is no limitation of the shape and size of the transported object to the foregoing embodiments.

What is claimed is:

1. A transporting apparatus which transports a transported object, comprising:
    air-supplying support means for supplying purified air toward a lower surface of the transported object to contactlessly support the transported object in a substantially horizontal orientation; and
    drive force application means provided only on one side of the transporting apparatus with respect to a lateral width direction that is perpendicular to a transporting direction for applying a drive force in the transporting direction to the transported object that is supported by the air-supplying support means, the driving force application means is adapted to apply driving force to the lower surface in one lateral end region of the transported object and has a plurality of rollers each of which is configured to rotate about an axis that extends substantially horizontal, the rollers being provided over the entire length of the transporting apparatus such that each transported object is contacted by the rollers at a plurality of locations at all times;
    a plurality of stop members spaced apart in the transport direction and configured to stop the transported object from moving in the lateral width direction by contacting the one lateral end of the transported object, the stop members being provided over an entire length of the transporting apparatus such that each transported object is contacted by the stop members at a plurality of locations at all times so that the stop members cooperate with the rollers to transport the transported object at all times;
    wherein the air-supplying support means includes a first fan provided on a right hand side region with respect to the transporting direction and a second fan provided on a left hand side region, and wherein one of the first fan and the second fan is operated with a greater rotation rate than the other such that the transported object is supported in an inclined orientation, and
    wherein an air supply portion of the air-supplying support means, viewed in the transporting direction, is inclined such that one lateral side of the air supply portion closer to the one side of the transporting apparatus is progressively lower than the opposite lateral side thereof, the air supply portion including the first fan and the second fan.

2. The transporting apparatus according to claim 1, further comprising:
    a restricting member that abuts against a surface of the side opposite, in the width direction, the one lateral end side to which drive force is applied by the drive force application means of the transported object to restrict movement of the transported object in the width direction.

3. The transporting apparatus according to claim 2, wherein the position of the restricting member can be adjusted in the width direction.

4. The transporting apparatus according to claim 1, wherein the drive force application means includes a plurality of rollers each of which is rotatable about respective axes extending substantially horizontal for contacting a lower surface of the one lateral end side of the transported object to apply the drive force.

5. The transporting apparatus according to claim 1, wherein at least some of the plurality of rollers are provided with the stop members to be rotatable with the corresponding rollers.

6. The transporting apparatus according to claim 1, wherein the air-supplying support means includes a dust removal filter for removing dust, and
    the transporting apparatus further comprising:
    a casing with a bottom surface, wherein the drive force application means is supported by the casing;
    a housing supported by the casing at a position above the bottom surface of the casing;
    wherein the dust removing filter and the first fan is housed within the housing with the dust removing filter located above the first fan whereby the dust removing filter and the first fan are modularized.

7. The transporting apparatus according to claim 6, wherein the purified air is produced by blowing air through the dust removal filter.

8. A transporting apparatus which transports a transported object, comprising:
    transporting means that can be altered between a horizontal transport state in which the transported object is supported in a substantially horizontal orientation, and an upright transport state in which the transported object is supported in a substantially upright orientation, the transporting means comprising:
    air-supplying support means for supplying purified air toward a lower surface of the transported object to contactlessly support the transported object; and
    drive force application means for applying a drive force in the transporting direction to the transported object, the drive force application means including a plurality of rollers, each of which is rotatable about respective axes extending substantially horizontally, and each of which defines a surface that extends substantially horizontally that provides a drive force by contacting the lower surface of the transported object when the transporting means is in the horizontal transport state, the rollers being provided only on one end side of the transporting apparatus with respect to a lateral width direction that is generally perpendicular to the transporting direction and provided over an entire length of the transporting apparatus such that each transported object is contacted by the rollers at a plurality of locations at all times;
    a plurality of restricting and supporting members that abut against a lateral end surface of the transported object, and that are spaced apart in the transported direction, wherein in the horizontal transport state, the restricting and supporting members restrict movement of the transported object in the lateral width direction, and in the upright transport state, the restricting and supporting members support the transported object, and wherein the restricting and supporting members are provided over the entire length of the transporting apparatus such that each transported object is contacted by the restricting and supporting members at a plurality of locations at all times so that the restricting and supporting members cooperate with the rollers to transport the transported object at all times.

9. The transporting apparatus according to claim 8, wherein the transporting means can be changed between the horizontal transport state and the upright transport state by swinging about a transverse shaft extending along the transporting direction.

10. The transporting apparatus according to claim 8, wherein the air-supplying support means reduces the amount of purified air that is supplied toward the lower surface of the transported object when the transporting means is changed from the horizontal transport state to the upright transport state.

11. The transporting apparatus according to claim 8, wherein the air-supplying support means, in the horizontal transport state, supports the transported object in a sloped orientation such that a distal end side in the width direction is positioned higher than the one lateral end side.

12. The transporting apparatus according to claim 8, further comprising:
    a casing with a bottom surface, wherein the drive force application means is supported by the casing;
    a housing supported by the casing at a position above the bottom surface of the casing;
    wherein the air-supplying support means has air-supplying units, in which a dust removal filter for removing dust and a fan for supplying purified air toward the lower surface of the transported object through the dust removal filter are incorporated into a single unit by virtue of the dust removal filter and the fan being housed within the housing, the air-supplying units being lined up in the transporting direction.

13. The transporting apparatus according to claim 12, wherein the air-supplying support means is provided with a blocking member that allows the passage of purified air that has passed through the dust removal filter and performs blocking such that foreign objects are prevented from falling toward the dust removal filter; and
    wherein the blocking member includes a porous member that allows the passage of purified air that has passed through the dust removal filter and a second filter that is positioned on the dust removal filter side of the porous member.

14. A transporting system comprising the transporting apparatus according to claim 8, wherein a fixed transporting apparatus for transporting the transported object in one of a horizontal and an upright orientation between itself and the transporting means is provided on the upstream side or the downstream side of the transporting means.

15. The transporting apparatus according to claim 8, wherein the air-supplying support means includes a first fan provided on a right hand side with respect to the transporting direction and a second fan provided on a left hand side, and
    wherein each of said fans rotate about an axis that extends substantially vertically when the transporting means is in the horizontal transport state.

16. The transporting apparatus according to claim 8, wherein the lower surface of the transported object is a bottom planar surface and the drive rollers support the bottom planar surface.

17. A transporting apparatus which transports a transported object, comprising:
    a casing having a bottom surface;
    a fan supported on the casing;
    a filter that is supported on the casing and that is disposed in opposition to the fan;
    a substantially horizontal porous member that is supported on the casing and that is provided in opposition to the filter;
    drive rollers that are supported on the casing at positions that are above the porous member and that drive the transported object by abutting against only one side of the transported object, the drive rollers being provided only on one side of the casing with respect to a lateral width direction and being distributed over an entire length of the casing such that at least some of the drive rollers are always in contact with the transported object to drive the transported object, wherein each of the drive rollers being rotatable about respective axes extending substantially horizontally and having a circumferential surface adapted to contact a lower surface of the one side of the transported object; and
    abutment portions different from the circumferential surface, the abutment portions being spaced apart in the transport direction and being adapted to abut a side surface of the one side of the transported object;
    wherein the casing is tilted such that its side opposite the one side is higher than the one side.

18. The transporting apparatus according to claim 17, further comprising:

a regulating roller disposed in a region on the side opposite the one side.

19. The transporting apparatus according to claim 18, wherein the position of the regulating roller can be moved in a width direction of the transported object.

20. The transporting apparatus according to claim 17, wherein a blowing force of the fan can be adjusted between a plurality of levels.

21. The transporting apparatus according to claim 17, further comprising:

a housing supported by the casing at a position above the bottom surface of the casing;

wherein the fan and the filter are housed within the housing whereby the fan and the filter are provided as a single unit.

22. The transporting apparatus according to claim 17, wherein each of the abutment portions is a surface that is rotatable with and extends substantially in a radial direction of the drive rollers.

23. The transporting apparatus according to claim 17, wherein each of the abutment portions is a lateral surface on a supporting roller that is supported by the casing and is rotatable about an axis extending perpendicular to the axes of the drive rollers.

24. The transporting apparatus according to claim 17, wherein the lower surface of the transported object is a bottom planar surface and the drive rollers support the bottom planar surface.

25. A transporting apparatus which transports a transported object, comprising:

a casing that can pivot about a shaft;

an actuator, one end of which is linked to the casing, that alters the position of the casing between a substantially horizontal position and a substantially vertical position;

a fan supported on the casing, the fan defining a plane of rotation;

a filter that is supported on the casing and that is disposed in opposition to the fan such that the filter extends substantially parallel to the plane of rotation;

a porous member that is supported on the casing and that is provided in opposition to the filter; and a plurality of rollers that are supported on the casing and that drives the transported object by abutting against the transported object, each of the drive rollers has a first portion that directly abuts a lower surface of the transported object when the casing is in the substantially horizontal position, and a second portion that is rotatable with the first portion and that contacts a side of the transported object when the casing is in the substantially vertical position.

26. The transporting apparatus according to claim 25, further comprising:

a housing supported by the casing at a position above the bottom surface of the casing;

wherein the fan and the filter are housed within the housing whereby the fan and the filter are provided as a single unit.

27. The transporting apparatus according to claim 25, wherein the shaft extends in the horizontal direction.

28. The transporting apparatus according to claim 25, wherein the drive member includes a plurality of rollers that are rotatable about axes that extend substantially horizontally when the casing is in a substantially horizontal position and that have circumferential surfaces that directly contact and support a surface of the transported object.

* * * * *